US005675499A

United States Patent [19]

Lee et al.

[11] Patent Number: 5,675,499
[45] Date of Patent: Oct. 7, 1997

[54] OPTIMAL PROBE POINT PLACEMENT

[75] Inventors: William T. Lee; Ronny Soetarman, both of San Jose; Christopher Graham Talbot, Menlo Park, all of Calif.

[73] Assignee: Schlumberger Technologies Inc., San Jose, Calif.

[21] Appl. No.: 626,484

[22] Filed: Apr. 2, 1996

Related U.S. Application Data

[62] Division of Ser. No. 228,027, Apr. 15, 1994, Pat. No. 5,530,372.
[51] Int. Cl.$^6$ ............................ G01R 31/28; G01R 31/26
[52] U.S. Cl. ............................ 364/488; 324/754; 324/758
[58] Field of Search ........................... 364/488, 489, 364/490; 324/754, 758, 158.1

[56] References Cited

U.S. PATENT DOCUMENTS

| 4,053,833 | 10/1977 | Malmberg et al. | 324/754 |
| 4,573,009 | 2/1986 | Fowler et al. | 324/758 |
| 4,706,019 | 11/1987 | Richardson | 324/754 |
| 4,721,909 | 1/1988 | Richardson | 324/754 |
| 5,389,874 | 2/1995 | King et al. | 324/758 |
| 5,392,222 | 2/1995 | Noble | 364/489 |
| 5,530,372 | 6/1996 | Lee et al. | 324/758 |

*Primary Examiner*—Vincent N. Trans
*Attorney, Agent, or Firm*—Bruce D. Riter

[57] ABSTRACT

Probe-point placement methods are described. A layout description, a netlist description and a cross-reference description of an IC are retrieved from storage. The data structures associate with each net name a list of polygons. Polygons of a selected net are broken into segments of a specified step size. Each segment is evaluated in accordance with a set of prober rules. Values produced by the prober rules are weighted and combined to obtain a prober score for each segment. The prober score indicates suitability of the corresponding net location for probing. If the best prober score indicates an optimal segment exists for probing, the coordinates of that segment are stored and used to direct a probe to the corresponding location of the IC. If the best prober score indicates no optimal segment exists for probing, each segment of the net is evaluated in accordance with a set of probe-point cutter rules. Values produced by the probe-point cutter rules are weighted and combined to obtain a cutter score for each segment. The cutter score indicates suitability of the corresponding net location for cutting a probe-point hole. A segment having the best cutter score is considered optimal for placing a probe point. The methods can be used, e.g., with electron-beam, focused-ion-beam and laser-beam systems, and with mechanical probe systems.

11 Claims, 25 Drawing Sheets

OPTIMAL PROBE POINT PLACEMENT

This application is a division of application Ser. No. 08/228,027, filed Apr. 15, 1994, now U.S. Pat. No. 5,530,372.

BACKGROUND OF THE INVENTION

1. Field of the Invention

The invention relates to methods and apparatus for placement of a probe point at an optimal location for probing of an IC, particularly in a mechanical-probe, electron-beam, focused-ion-beam or laser-beam system.

2. The Prior Art

Charged-particle beam systems are commonly used in verification, characterization, design debug and modification of devices such as integrated circuits. Electron-beam probe (EBP) systems are used to acquire and observe waveforms on internal nodes of a device as the device is exercised by application of a signal pattern to the external pins of the device, and to produce voltage-contrast images of the device.

Focused-ion-beam (FIB) systems are commonly used to perform three major functions: (1) etching/milling of structure, such as for cutting metal lines and drilling holes, (2) depositing material, such as for forming metal connectors and pads, and (3) scanning ion microscope (SIM) observation. These functions may be employed to modify the IC for failure analysis. Cutting and connecting metal lines aids in confirmation of a suspected failure mechanism or failure location, and milling holes in an insulation layer allows a "buried" conductor to be exposed or connected to a pad for improved E-beam or mechanical probing.

FIGS. 1 and 2 show the general structure of a prior-art charged-particle beam system. Commercially-available systems having such a structure include the "IDS 5000™" EBP system and "IDS 7000 FIBstation™" FIB system, available commercially from Schlumberger Technologies, Inc., of San Jose, Calif. Such systems are described, for example, in U.S. Pat. Nos. 4,706,019 and 4,721,909 to N. Richardson and U.S. Pat. No. 5,140,164 to Talbot et al., the contents of which are incorporated herein by this reference.

A charged-particle beam system 110 has three main functional elements: an electron beam or focused ion beam 112, a circuit exerciser 114, and a data processing system 116 which includes a display terminal 118. Data processing system 116 includes a processor P with associated memory M and a data store D such as a disk drive. Circuit exerciser 114 may be a conventional integrated circuit tester, such as a model "S15™" tester (available from Schlumberger Technologies of San Jose, Calif.) which can repeatedly apply a pattern of test vectors to the specimen circuit over a bus 124. The device (such as an IC which can be in wafer form) 126 is placed in a vacuum chamber 128 of probe 112. Data signifying the locations on device 126 at which the beam is to be directed are sent to probe 112 by data processing system 116 over a bus 122. Data processing system 116 may also be used to control circuit exerciser 114. System 110 can be controlled by an operator who inputs commands through display terminal 118.

Referring to FIG. 2, one such prior-art test probe 112 includes three elements mounted to a surface 225: a stage 226, a probe card 228, and a focused-beam column 229. Column 229 generates a charged-particle beam directed along axis 236. The electron beam passes through openings in surface 225 and probe card 228. The point at which the beam strikes device 126 (shown as a wafer in FIG. 2) is determined by the position of column 229 (controllable by means of an x-y stage 240) and by the deflection of the beam (controllable by means of x-y deflection coils 241).

Such systems combine on a single workstation the display of a schematic circuit diagram, layout mask data and a live scanning-electron microscope (SEM) or scanning-ion microscope (SIM) image of the chip, along with analog and/or digital waveforms. The SEM (or SIM), layout and schematic displays in the prior-art Schlumberger systems are linked together to facilitate navigation around the IC chip. For example, when the user pans (moves laterally) or zooms (changes magnification) one of the linked displays, the others pan or zoom accordingly. When the user places a probe icon at a point on one of the linked displays, expected waveforms and actual measured waveforms at that point may be displayed for comparison.

FIG. 3 illustrates an example of linked schematic, layout, and SEM images produced with an IDS 5000 system with the magnification set to produce a relatively wide field of view. The conventional Schlumberger systems display such images in multiple colors to provide the user with additional information such as the layer or net to which a particular displayed feature belongs. Schematic image 310 represents a portion of a circuit embodied in a device. Layout image 320 represents approximately the same portion of the circuit as is displayed in schematic image 310. SEM image 330 represents approximately the same portion of the circuit as is displayed in layout image 320. Examination of layout image 320 and SEM image 330 indicates a close correlation between the displayed circuit features. Superposed on layout image 320 and SEM image 330, respectively, are boxes representing a layout window 340 and a SEM window 350 which delimit the field of view of the probe for a given stage position at an increased level of magnification. As the field of view is zoomed in and out in response to commands from the user, the displayed images zoom in and out correspondingly. Layout window 340 and SEM window 350 represent approximately the same field of view of the circuit once the images have been linked.

When using an EBP system, the operator spends a lot of time searching for the best place to position the electron-beam probe to get the best signal measurement. The best signal is obtained from a probe location that has the highest signal-to-noise (S/N) ratio and lowest cross-talk from neighboring signals. Higher S/N reduces the noise given a fixed waveform acquisition time and lower crosstalk reduces undesirable signal distortions so as to yield a truer waveform.

When using a FIB system, the operator spends a lot of time searching for the best place to cut a probe hole. This hole is cut through passivation on passivated devices to reach the topmost conducting layer, or through inter-layer dielectric on passivated devices and on unpassivated or depassivated devices to reach lower conducting layers. A probe hole can be filled with conducting material or left unfilled. This imposes constraints on the size and position of the hole. The probe hole may or may not be allowed to cut through particular higher-layer conductors to reach signals of lower-layer conductors. For example, cutting through a narrow clock-signal conductor is undesirable, while cutting through a wide power bus may be acceptable. This imposes further constraints on where a hole can be cut. The goal of cutting a probe-point hole is to allow a prober, EBP or mechanical prober (MP), to measure a waveform from a buried signal conductor.

Systems for analytical mechanical probing of sub-micron structures are known which use a manipulator to position a probe needle while the operation is observed with a high-magnification microscope. Such systems are commercially available from sources including Karl Suss, Alessi, and Wentworth. Another type of MP is the atomic force microscope (AFM), in which a sharp probe tip is scanned over a sample surface. Such systems are commercially available from Veeco Instruments, Inc. See, e.g., D. RUGAR et al., *Atomic Force Microscopy*, PHYSICS TODAY, October 1990, pp. 23–30.

When a computer-aided design computer-aided engineering (CAD/CAE) system for IC design is used to lay out the mask for a new device, there is little or no consideration of the accessibility of each signal to a probe system. Unlike the area of design-for-testability (DFT), where extra signals and specific structures are added to improve internal signal controllability and observability via the device pins, there is no such design-for-probe modifications provided with most IC design software today. This can result in devices being manufactured which can be tested to find out which pass and which fail, but which cannot be diagnosed using probe methods to find out why and where the failing devices failed.

One prior effort to address this problem is disclosed in U.S. Pat. No. 5,392,222 of Alan C. Noble granted Feb. 21, 1995, the disclosure of which is incorporated herein by this reference. The approach is employed in Optimal Probe Placement (OPP) software from Schlumberger Technologies, ATE Division, Diagnostic Systems Group, as part of the Integrated Diagnostic System (IDS) product family. Unlike the "interactive" methods of the present invention, the OPP methods perform a "batch" mode operation and are based on a different methodology.

In the OPP methods, polygons describing physical structure of the IC device are associated with signal nets of the device. The layout files are processed to successively eliminate those polygons which are deemed unusable for probing. The polygons remaining after such pruning are deemed optimal for probing, and the operator can use any of these. The Dracula Design Rule Checker (DRC) and Layout-Versus-Schematic (LVS) software tools are used to eliminate unusable polygons from consideration. The OPP methods employ polygon resizing rules to shrink or expand polygons by a specified amount, as well as rules for checking overlap of polygons using logical operations such as AND/OR/NOT.

The OPP methods impose a "Width" rule, a "Depth" rule, and a "Proximity" rule on the polygons to determine which are suitable for probing. (Other rules provided with the present invention are not support in the OPP methods.) The Width rules shrinks all polygons by a MinWidth parameter to eliminate all polygons smaller than MinWidth. Referring to FIG. 4, a polygon 400 and a polygon 410 are each reduced in size by MinWidth using Dracula's SIZE command. Polygon 400 is extinguished as shown at 420, but a reduced-size polygon 430 remains of polygon 410. Polygon 430 is then enlarged by MinWidth to provide a polygon 440 equal to polygon 410. The Depth rule finds intersections between polygons of different layers, and eliminates obscured lower layer polygons from consideration using Dracula's AND, OR and NOT operators. FIG. 5 shows a polygon A (500) overlying a polygon B (510) such that a part of polygon B is inaccessible for probing. Application of the OPP Depth rule leaves polygon A (500) and transforms polygon B into polygons C (520 and 530) which are suitable for probing. The Proximity rule oversizes all polygons by a MinSpace parameter, then checks for overlap between adjacent polygons, and eliminates any that overlap. This ensures that polygons closer than MinSpace from a neighbor will not be probed. Dracula's SIZE and CUT rules are used. As shown in FIG. 6, adjacent polygons A (600), B (610), C (620) are enlarged by MinSpace to produce polygons A' (630), B' (640), C' (650). Polygon B' overlaps polygon A', so both are eliminated to leave polygon C" (660). Polygon C" is reduced by MinSpace so that a polygon C'" (670) remains for probing.

Techniques are known for applying a set of probing point selection rules to the complete area of a desired wire with the intent to minimize local field effect, crosstalk and circuit structure influences. See, e.g., R. SCHARF et al., *DRC-Based Selection of Optimal Probing Points for Chip-Internal Measurements*, PROC. INT. TEST CONF. 1992, Paper 39.2, pp. 840–847. The Scharf et al. method requires topological computations like Boolean operations or sizing, which are provided in commercially-available design rule check (DRC) tools. See also P. GARINO et al., *Automatic Selection of Optimal Probing Points for E-Beam Measurements*, EOBT, 1991, Como, Italy, pp. 88–96; R. SCHARF et al., *Layout Analysis and Automatic Test Point Selection for Fast Prototype Debug using E-Beam or Laser-Beam Testsystems*, IEEE Custom Integrated Circuits Conference (CICC), 1992, Boston, Mass., USA, pages 17.3.1–4; R. SCHARF et al., *CAPT/IVE: Computer Aided Prototype Testing using an Integrated Verification Environment*, Northcon/91, 1991, Portland, Oreg., USA, pp. 370–375; K. HERRMANN et al., *Design for e-beam testability—A demand for e-beam testing of future device generations?*, MICROELECTRONIC ENGINEERING, Vol. 7, 1987, pp. 405–415; W. LEE, *Engineering a Device for Electron-Beam Probing*, IEEE DESIGN & TEST OF COMPUTERS, Vol. 6, 1989, pp. 36–49; A. NOBLE et al., *Increasing Automation in Diagnostic Processes*, EE-EVALUATION ENGINEERING, Vol. 5, 1992, pp. 10–14.

While methods employing a variety of EBP placement rules are known from the above, none is believed comprehensive enough to direct probe-point cutting operations where a FIB or laser-beam is to be used in combination with an EPB or MP, and none is believed suitable for interactive (rather than batch) operation.

SUMMARY OF THE INVENTION

In accordance with the invention, methods are provided which take into account the considerations imposed by the use of probing systems (e.g., EBP or MP) and probe point cutting systems (e.g., FIB or laser). Such methods can be performed interactively at "run-time" to help system operators select optimal probe-point locations. Apparatus employing the methods of the invention can identify a "best" probe location within a matter of seconds, offering significant productivity gains over manual (visual) search methods requiring minutes. Time is saved in identifying the best probe location, and use of optimal probe points each time the device is probed yields acceptable-quality waveforms in less time. Reduced cross-talk reduces the likelihood of misinterpreting signals and making wrong decisions during analysis.

Methods of the invention can also be used during design of an IC to analyze accessibility of each signal, especially critical signals, to probing. If embedded within the routing engine of the design system, the methods can be used to optimize the IC's layout for later diagnosis with probers. This can yield more diagnosable designs, reducing device debug times, allowing faster time-to-market, and increasing profits.

In preferred embodiments, a layout description, a netlist description and a cross-reference description of the IC are retrieved from storage. Data structures associate with each net name a list of polygons. Polygons of a selected net are broken into segments of a specified step size. Each segment is evaluated in accordance with a set of prober rules. Values produced by the prober rules are weighted and combined to obtain a prober score for each segment. The prober score indicates suitability of the corresponding net location for probing. If the best prober score indicates an optimal segment exists for probing, the coordinates of that segment are stored and used to direct a probe to the corresponding location of the IC. If the best prober score indicates no optimal segment exists for probing, each segment of the net is evaluated in accordance with a set of probe-point cutter rules. Values produced by the probe-point cutter rules are weighted and combined to obtain a cutter score for each segment. The cutter score indicates suitability of the corresponding net location for cutting a probe-point hole. A segment having the best cutter score is considered optimal for placing a probe point.

DETAILED DESCRIPTION

Preferred rules in accordance with the invention are first described. Preferred methods of applying the rules are then described.

I. Rules
A. Prober Rules
1. Widest—The Width Rule

Figure 8:
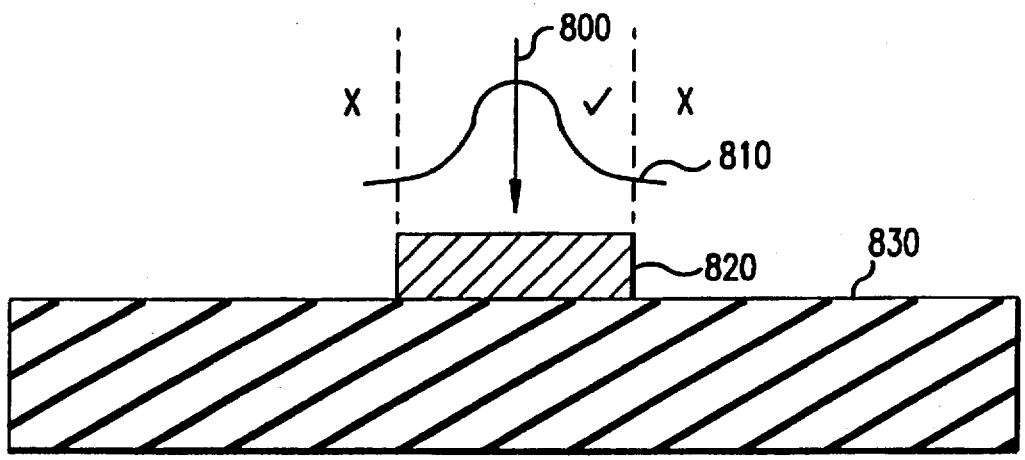
FIGS. 8–10 illustrate Width Rules in accordance with the invention.

Referring to FIG. 8, the primary beam 800 of electrons in an EBP strikes the device with a Gaussian cross-sectional profile as represented at 810. The spot size is typically 0.1 micron or less for contemporary EBP systems. (Spot size is normally defined as the cross-sectional diameter of the primary beam where the intensity falls to half maximum, known as full-width half-maximum or FWHM.) If a 0.5 micron wide exposed conductor 820 is probed, most of the primary beam lands on the conductor if the beam is positioned on the conductor's mid-point. But some small percentage of the primary electrons will land on nearby insulator 830 instead of the conductor, degrading signal accuracy and increasing noise due to secondary electron yield variations caused by changes in topography and material. The degradation is greater for smaller conductors and larger primary beam spot sizes. It is also greater if the conductor is not exposed, but buried.

Figure 9:
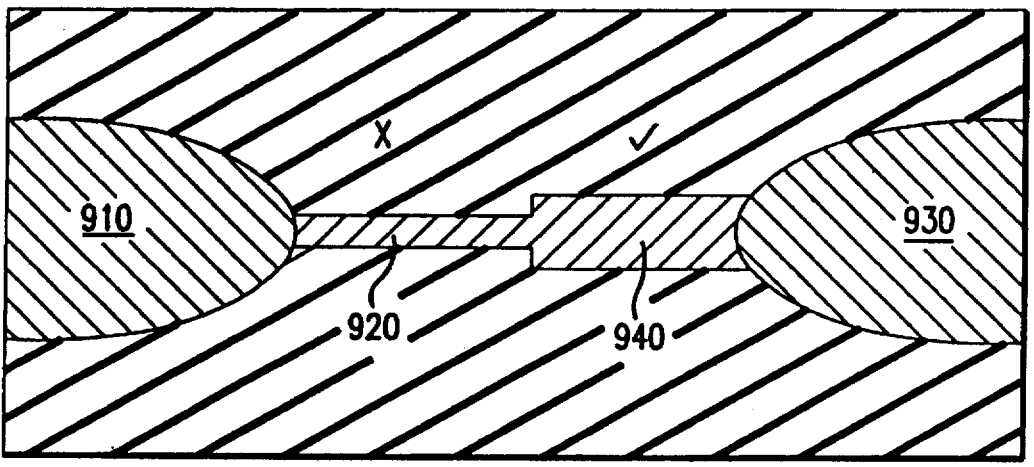

Referring to FIG. 9, the ease with which an operator can land a mechanical probe needle on a conductor is proportional to the conductor's width. Landing a 0.5 micron probe needle 910 on a 0.3 micron wide portion 920 of a conductor is difficult. A 0.5 micron probe needle 930 is more easily landed on a 0.5 micron wide (or wider) portion 940 elsewhere on that same conductor.

Figure 10:
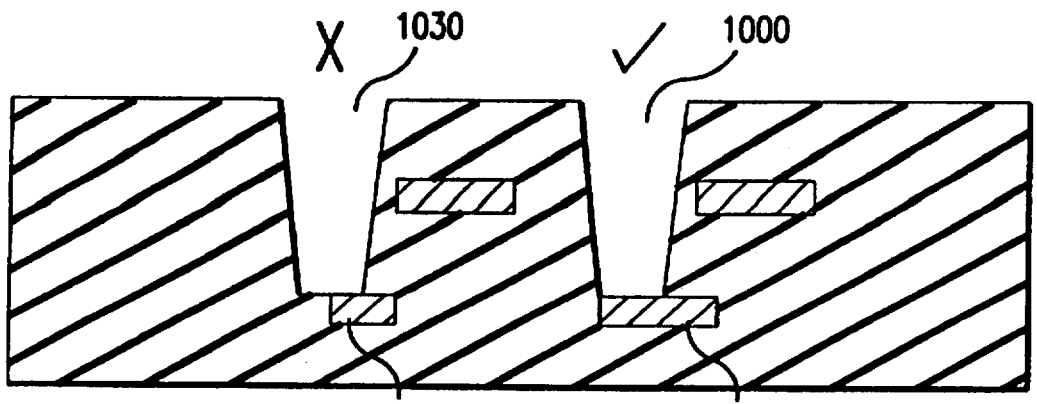

When milling with a FIB to expose a conductor, there is always the possibility of small misalignment between successive layers caused by mask registration errors during manufacturing. The likelihood of cutting a probe hole down to a small lower level conductor is greater the wider the target conductor is. Referring to FIG. 10, it is preferred to mill a probe hole 1000 to expose a conductor at a wider portion 1010 than to mill a probe hole 1030 to expose the conductor at a narrower portion 1020.

2. Highest—The Depth Rule

Figure 11:
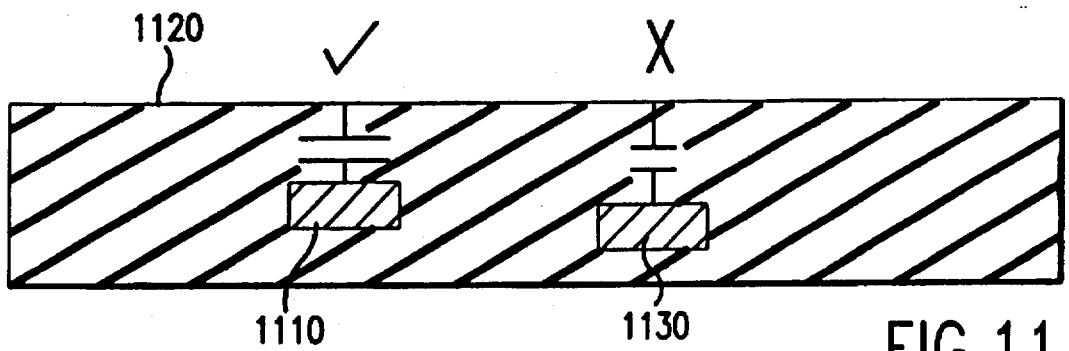
FIGS. 11–13 illustrate Depth Rules in accordance with the invention.

In an EBP, the waveform from a buried conductor is acquired by measuring the surface potential which is capacitively coupled through the insulating dielectric between the surface and the buried conductor. The capacitive coupling effect grows with decreasing separation of surface and buried layer. The closer a conductor is to the surface, the greater the capacitive coupling, and the better the measured signal from the surface. Referring to FIG. 11, it is preferred to probe a conductor 1110 closer to surface 1120 than a deeper conductor 1130.

Figure 12:
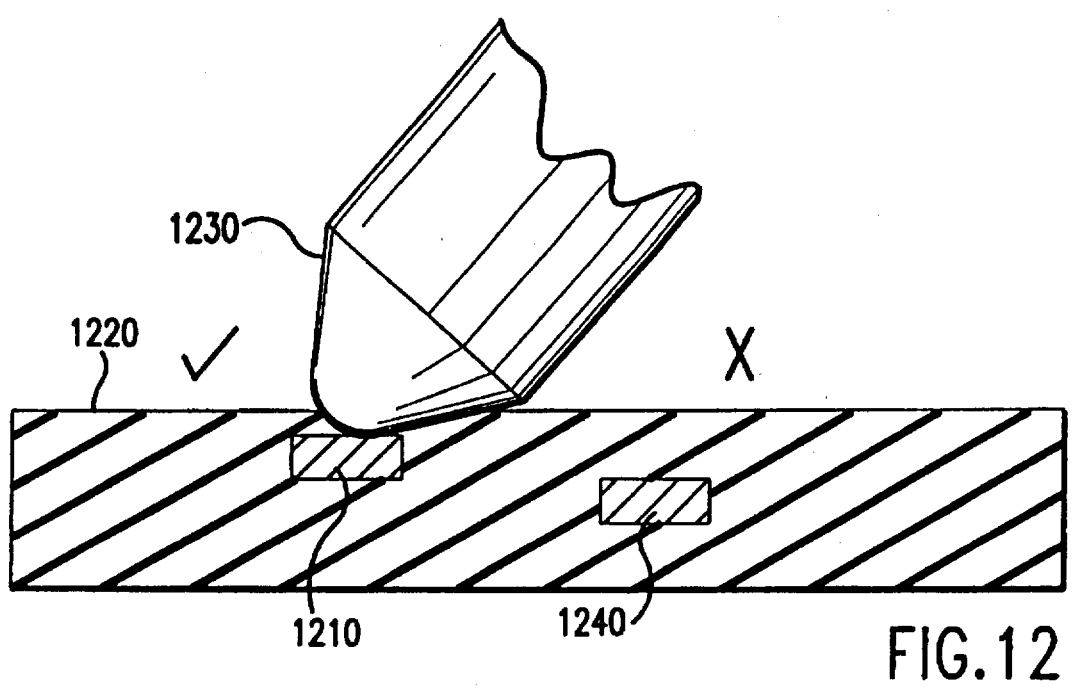

In an MP, physical probe access is most likely to be possible for the uppermost layers after stripping back passivation using chemicals and sometimes dielectric below the passivation using reactive ion etchers. Again, upper layers are better because they are more accessible. Referring to FIG. 12, a conductor 1210 nearer the surface 1220 is more accessible to MP needle 1230 than is a deeper conductor 1240.

Figure 13:
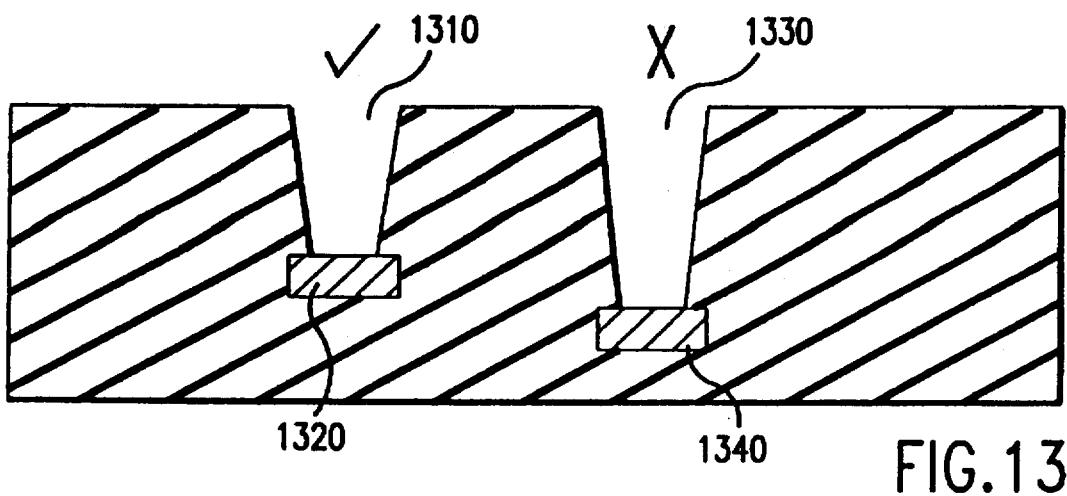

With a FIB, the time required to cut a probe hole is approximately proportional to the depth of the hole. Again, upper layers are easier and quicker to reach than lower layers. Referring to FIG. 13, less time is required to mill a hole 1310 to access conductor 1320 than to mill a hole 1330 to access a deeper conductor 1340.

3. Furthest—The Proximity Rule

Figure 14:
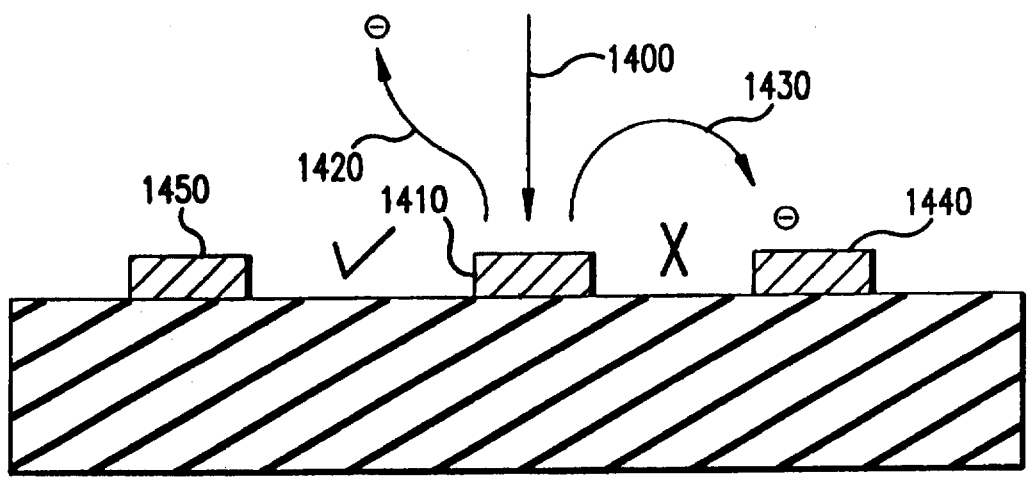
FIGS. 14–16 illustrate Proximity Rules in accordance with the invention.

In an EBP, the acquired waveform is derived from secondary electrons collected from the surface at the point where the primary beam of electrons lands. These secondary electrons are of low energy and easily affected by local electric field effects. The strong local field effect provided by the target conductor modulates the number and energy of secondaries that escape from the surface to reach the EBP system's detector to create the waveform for display. There can also be strong undesirable influences on the secondaries from nearby conductors, whether on the surface or buried. For topmost exposed conductors, the degradation is a function of the electric fields that influence the secondaries. For buried conductors, the degradation is via undesirable capacitive-coupling to the point where the primary beam lands. Either way, the undesirable crosstalk is less from neighboring conductors that are further away. Referring to FIG. 14, an e-beam 1400 incident on conductor 1410 produces secondary electrons 1420 and 1430 Secondary electrons 1430 are affected by a nearby conductor 1440. A conductor 1450 which is far enough away has no significant influence.

Figure 15:
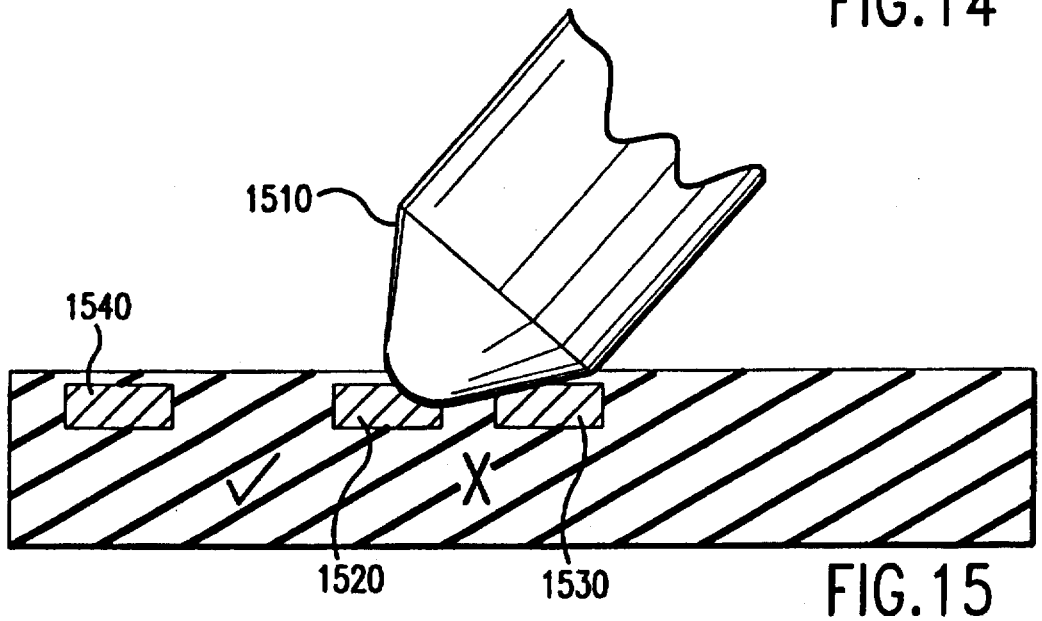

With a MP, the ability to land a probe needle on one conductor without also contacting a neighboring conductor is reduced if the neighbors are further away. This is especially important with contemporary device geometries where an operator is forced to land 0.5 micron probes that can easily become dull and increase to a tip radius of >1 micron. Several conductors can thus be contacted simultaneously. Referring to FIG. 15, a probe needle 1510 intended to contact conductor 1520 can also contact conductor 1530 if the latter is too close to the probe location. Selecting a location to probe conductor 1520 where the nearest conductor (e.g., conductor 1540) is farther away reduces the risk of unintentionally contacting conductors other than the on to be probed.

Figure 16:
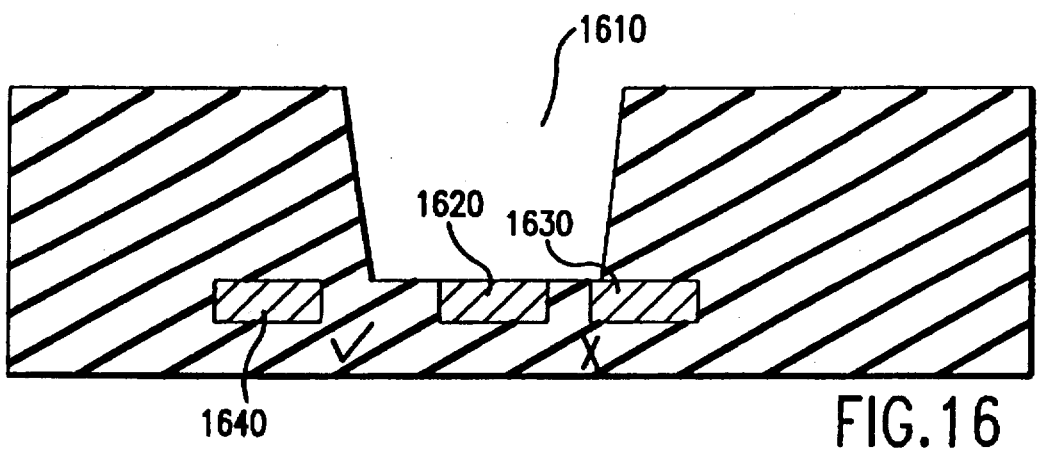

With a FIB, the ability to cut down to a small buried conductor without also inadvertently reaching a neighboring conductor improves with increasing separation of target conductor from neighboring conductors. Also, when cutting a probe hole past mid-level conductors to a lower level conductor, the chance of cutting through part or all of a mid-level conductor by accident is reduced if the mid-level conductors are further away. As mentioned above, these possibilities exist because of the possible misalignment between layers introduced during manufacturing. Referring to FIG. 16, cutting a probe hole 1610 to expose conductor 1620 can also expose a nearby conductor 1630. Selecting a location to expose conductor 1620 where its nearest neighbor (e.g., conductor 1640) is farther away reduces the risk of exposing more than the intended conductor.

An exception to this rule is that, in an EBP, it is better to be closer to a neighboring conductor if that neighbor is a power or ground line, especially a ground line. Such a neighbor has a beneficial "shielding" effect because its associated electromagnetic field is static and its associated capacitive-coupling effect is zero.

4. Centermost—The Centrality Rule

Figure 17:
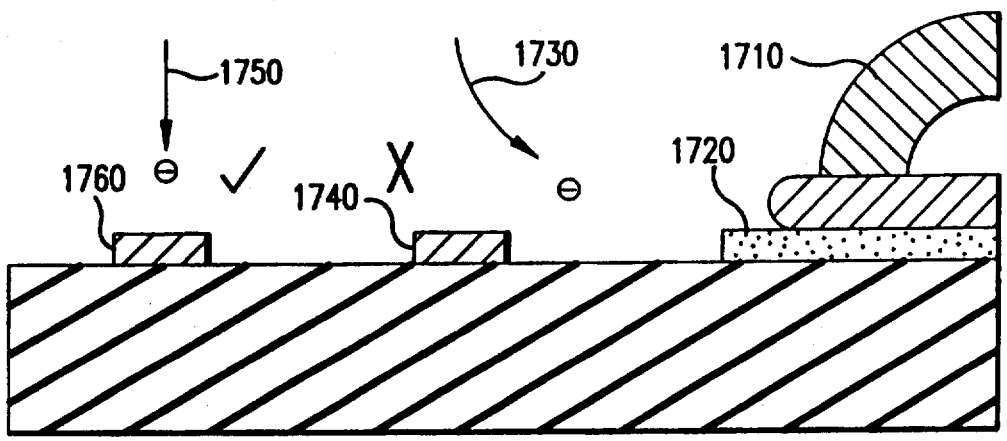
FIGS. 17–19 illustrate Centrality Rules in accordance with the invention.

With an EBP, electromagnetic influences of the bond wires and package of the IC can affect the trajectory of the primary beam of electrons. If the primary beam does not land on the target correctly, noise can increase because the beam lands partially or completely off the conductor and/or cross-talk can increase because the beam lands closer to a neighboring conductor. All else being equal, it is preferred to probe as far as possible from the periphery of the device (e.g., closer to the center of the device). Referring to FIG. 17, a bond wire 1710 is connected to a bond pad 1720 near the periphery of an IC. Electric fields from bond wire 1710 and bond pad 1720 interfere with an electron beam 1730 used to probe a conductor 1740 which is too near. The electron beam 1750 used to probe a conductor 1760 which is farther from the bond pad and bond wire is not measurably affected.

Figure 18:
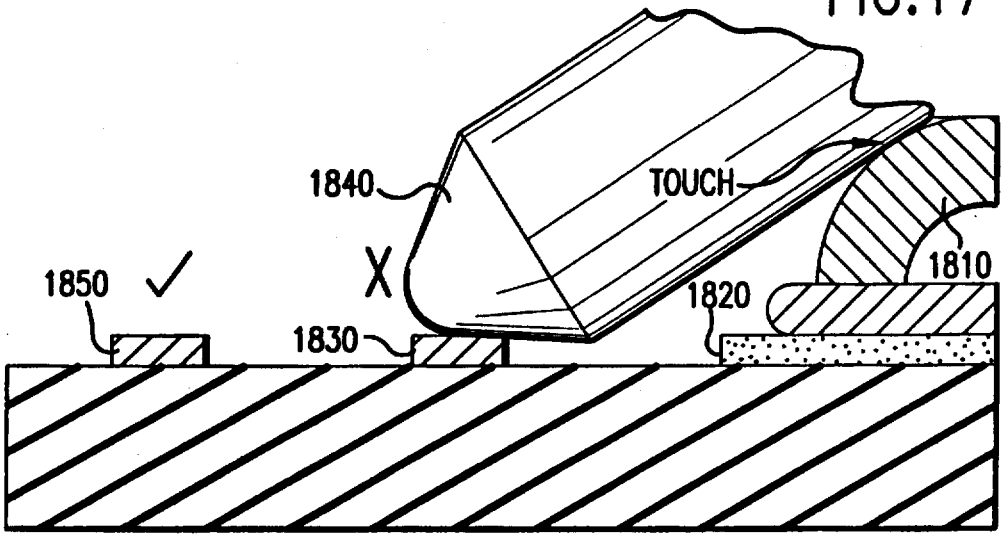

With an MP, staying away from the periphery reduces the chance of having the probe needle accidentally contact or break a bond wire. Probe needles are slanted relative to the IC's surface so the tip can be visually positioned relative to the intended probe location. Referring to FIG. 18, a bond wire 1810 is connected to a bond pad 1820 near the periphery of the IC. Attempting to probe a nearby conductor 1830 with a probe needle 1840 can result in the probe needle touching the bond wire. It is preferable to probe a conductor 1850 which is farther from the bond wire.

Figure 19:
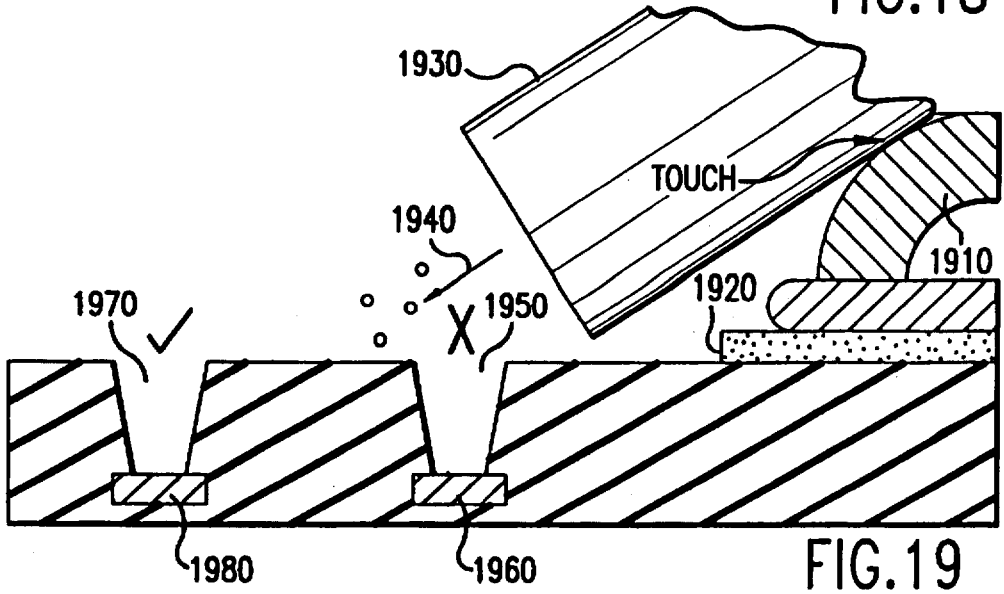

With an FIB, probe holes are sometimes filled with conducting material in order to bring the signal from a buried conductor up to the surface where an EBP or MP has easier access. This deposition of conducting material takes place when the primary ion beam interacts with gas molecules containing the conducting material. The gas molecules are introduced by a nozzle in close proximity to the point where the ion beam lands. Keeping the nozzle away from bond wires minimizes the chance of operator error causing bond wire damage with the nozzle. Referring to FIG. 19, a bond wire 1910 is connected to a bond pad 1920 near the periphery of the IC. Positioning nozzle 1930 so that gas jet 1940 can assist ion-beam etching or filling of probe hole 1950 to access conductor 1960 can result in the nozzle touching bond wire 1910. It is preferable to cut a probe-access hole 1970 to expose a conductor 1980 which is farther from the bond wire.

B. Probe Point Cutter Rules

1. Safest—The Safety Rule

Figure 20:
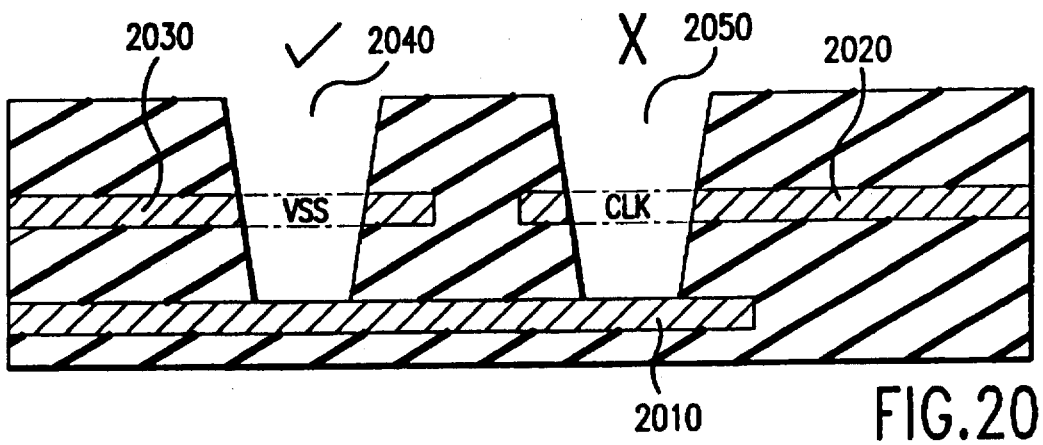
FIG. 20 illustrates a PPC Safety Rule in accordance with the invention.

With a FIB, it is better not to cut through any conductor in order to reach another. The goal is to leave the functionality of the device unchanged. Clock and control signals are especially important, followed by other data signals. Power and ground lines are least important since they tend to be wide and redundantly available. FIG. 20 shows a conductor 2010 to be probed which in one region lies below a conductor 2020 carrying a clock signal CLK and in another region lies below a wide conductor 2030 carrying ground VSS. It is preferable to mill a probe-access hole 2040 through conductor 2030 than to mill a probe-access hole 2050 through conductor 2020.

2. Fastest—The Mill Rule

Figure 21:
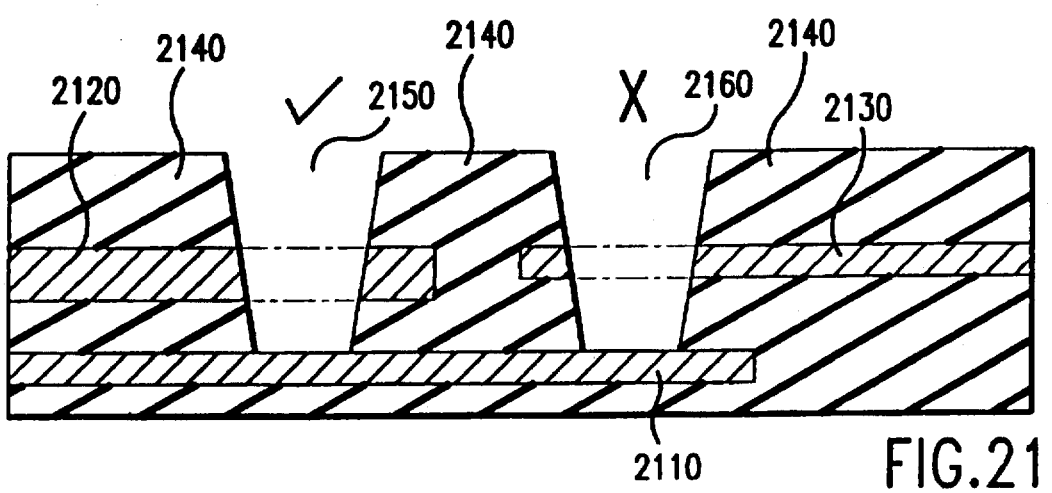
FIG. 21 illustrates a PPC Mill Rule in accordance with the invention.

With a FIB, the rate of milling is dependent on the material being milled. If there is a choice between two probe hole candidates, the one that can be milled faster based on the material being removed should be chosen. FIG. 21 shows a conductor 2110 to be probed which in one region lies below a thick conductor 2120 and in another region lies below a thinner conductor 2130. Assuming that the conductor material mills faster than insulator material 2140, it is faster to mill a probe-access hole 2150 through conductor 2120 (less insulator thickness to mill) than to mill a probe-access hole 2160 through conductor 2130 (more insulator thickness to mill).

3. Flattest—The Flatness Rule

Figure 22:
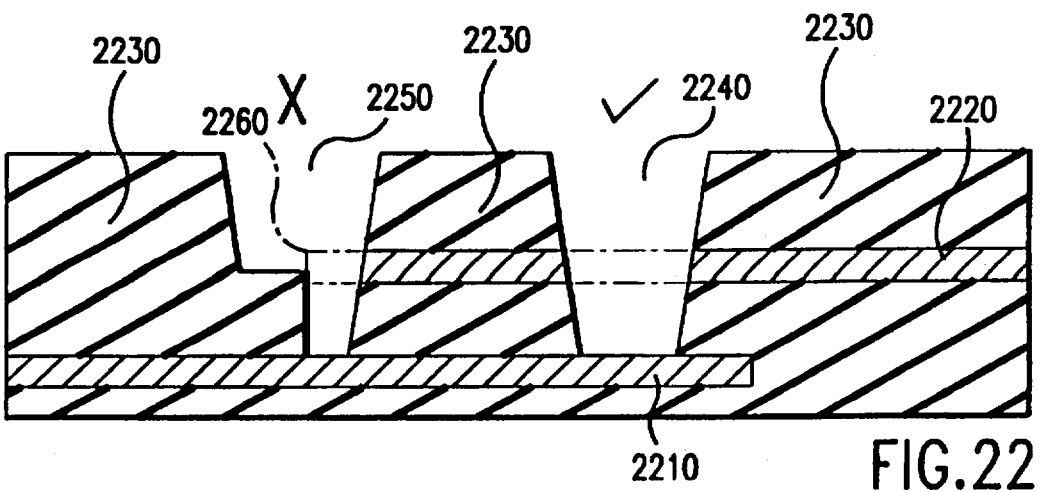
FIG. 22 illustrates a PPC Flatness Rule in accordance with the invention.

The bottom of the probe hole should remain as flat as possible. This is so that, for example, one part of the hole does not cut through the conductor of interest while another part of the hole has not yet reached the conductor. The bottom of the probe hole can become uneven if the hole overlaps with parts of conductors between the surface and the target layer. Such partial overlap leads to an uneven hole bottom because rates of milling differ for different materials. This problem can be reduced by selecting probe hole candidates that are wholly inside or outside other conductors if viewed from above, such that the entire surface of the bottom of the hole always mills at the same rate. FIG. 22 shows a conductor 2210 to be probed which lies partially hidden below a conductor 2220. Assuming that conductor material mills faster than insulator material 2230, it is preferable to mill a probe-access hole 2240 where conductor 2220 extends through the entire hole region (flatter hole bottom) than to mill a probe-access hole 2250 where a material discontinuity such as conductor edge 2260 is present (differing mill rates across the hole bottom produces an uneven hole). Further milling of uneven hole 2250 could sever conductor 2210 before it is exposed enough for probing, or fail to uncover enough of conductor 2210 for adequate probing.

II. Preferred Implementations

A. Methodology

Figure 7:
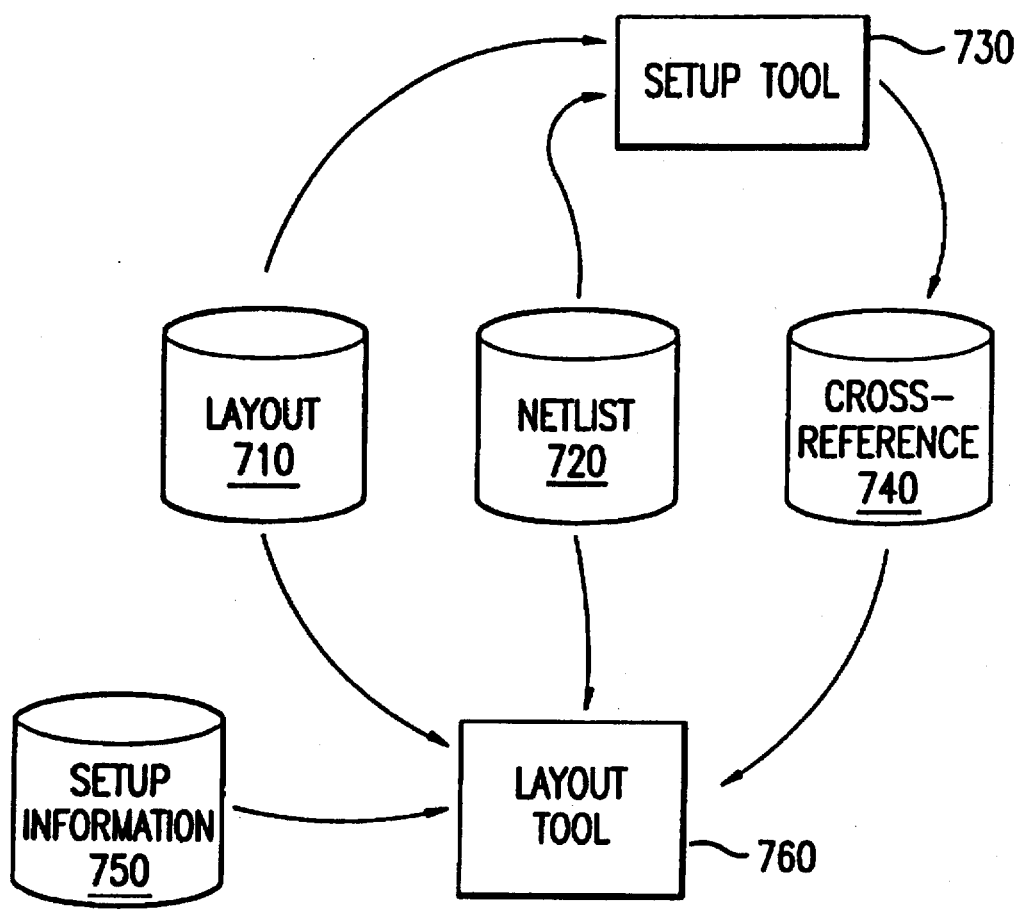
FIG. 7 shows using stored layout and netlist files to produce a cross-reference file.

An IC design is typically prepared using CAD tools to produce a layout description which defines the geometry of the IC as a set of polygons separated into layers, the connectivity of the IC's nets and devices as a netlist, and layer order information. Referring to FIG. 7, these are typically stored as a layout description file 710, a netlist description file 720 and a setup information file 750. It is customary in systems such as the Schlumberger IDS-class systems to prepare (using a Setup Tool facility 730) and store a cross-reference description file 740 which links polygons of the layout description with nets of the netlist description file so that polygons making up a conducting signal path can be readily identified. A net name is attached to each polygon in the cross-reference description file. This processing can be performed using Cadence Dracula extraction software, for example. If a netlist describing the device circuitry is provided, the Dracula software can correlate the nets found in the layout with signal names from the netlist.

In the Schlumberger IDS-class systems, invoking the Layout Tool facility 760 retrieves from storage the layout description, the netlist description, the layer order information and the cross-reference description. The polygons can be displayed using a layout display facility such as the Layout Tool of Schlumberger's IDS family of systems. Layout Tool displays these polygons with different colors assigned to different layers. Polygons can be displayed selectively by layer or by cell hierarchy. It is possible, for any given polygon, to see if it is part of a conducting signal line or not, and if it is, whether the line carries a power, ground, clock, control or data signal. A signal line with a name such as PWR, VCC, VDD is normally a power line. A signal line with a name such as GND, VSS is normally a ground line. A signal line with a name such as CLOCK, CLK is normally a clock line. A signal line with a name such as ENABLE, ENB, RESET, RST, etc. is normally a control line. All others can normally be treated as data lines.

Signals of interest can be selected using a screen cursor controlled by a mouse, or by typing in the desired signal name. The user can select a signal of interest for probing by any of a variety of means, such as by entering a signal name, or by selecting a signal name from a list, or by selecting a net from a schematic or layout display. The signal net of interest typically traverses multiple layers of the IC, such as Metal2 (M2), Metal1 (M1) and polysilicon, and meanders within layers.

Though the following description refers to the layout data in terms of polygons, those of skill in the art know will recognize that typical layout data may contain polygons of general n-vertex shapes as well as trapezoids having at most 4 vertices with two opposing lines being parallel. The input polygons and trapezoids, referred to simply as polygons herein, are normally extracted from a file in the industry-standard GDS2 format, though other formats such as Apple and CIF are not uncommon. The netlist description file can be used to augment each polygon with its associated signal name (or net name, such as CLOCK, GROUND, etc.) through the application of the Dracula software or similar extraction and layout-versus-schematic (LVS) comparison software. Setup information file 750 provides layer ordering (top to bottom) and optional material thickness information to indicate relative top-down ordering and thicknesses for each polygon. In accordance with the invention, setup information file 750 preferably also includes rule weightings, min/max spacing parameter, step size and other user-specified values, as well as user-specified names for power and ground lines, clock and control lines, etc.

Figure 23:
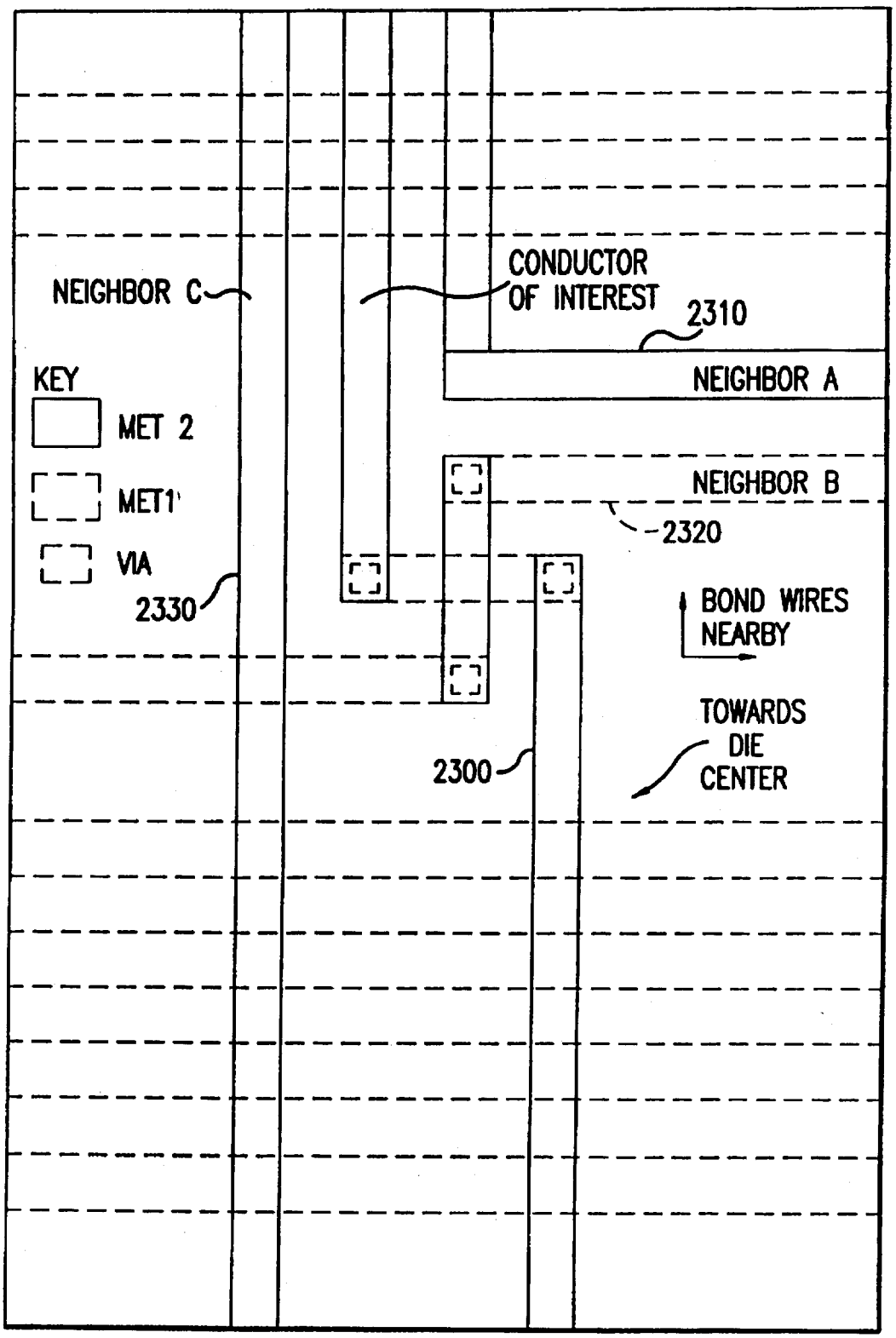
FIG. 23 shows a portion of an IC layout.

FIG. 23 shows an example of a portion of an IC in which the Metal2 (M2) layer is shown in solid lines and the Metal1 (M1) layer and vias connecting layers M1 and M2 are shown in dashed lines. A polysilicon layer (not shown) underlies the M1 layer. A conductor 2300 of a net XX of interest has neighboring conductors A (2310), B (2320) and C (2330). Conductor 2300 lies in the M2 layer except where it goes now to the M1 layer to pass under neighbor B (2320), Bond wires are near the upper and right borders of the image, and the center of the die is down and to the left.

Preferably all polygons associated with the signal of interest are collected in a polygon list LP. Polygons of the list are analyzed one at a time, in incremental segments of a predetermined size. The analysis looks at the entire width of the polygon, evaluating each segment of the polygon in stepwise fashion for probing suitability in accordance with defined rules. The analysis proceeds from one polygon to the next until the whole net has been evaluated. For each segment, a set of weighted and normalized prober rules is applied to compute a prober score which indicates suitability of the segment for probing. Application of the prober rules indicates, for example, if any points of a signal line are accessible without cutting a probe-point opening. The segment(s) having the "best" prober score are considered optimal for probing.

Normalization involves scaling the result to be between zero and one where one represents the largest possible result and zero the smallest. This ensures that no one rule eclipses the others. The user-specified weights are maintained outside the normalization process so as to retain their intended purpose. An example of a normalization where a raw score of 3 out of a possible maximum of 12 and a weight of 6 would yield $6*(3/12)=1.5$ while another with raw score 7 out of a possible maximum of 8 with a weight of 2 would yield $2*(7/8)=1.75$. Typically, the depth rule is most important of the prober rules, followed by width, proximity and centrality. Thus, a typical set of weights would be Depth Rule Weight DRW=4, Width Rule Weight WRW=3, Proximity Rule Weight PRW=2, Centrality Rule Weight CRW=1.

Figure 24:
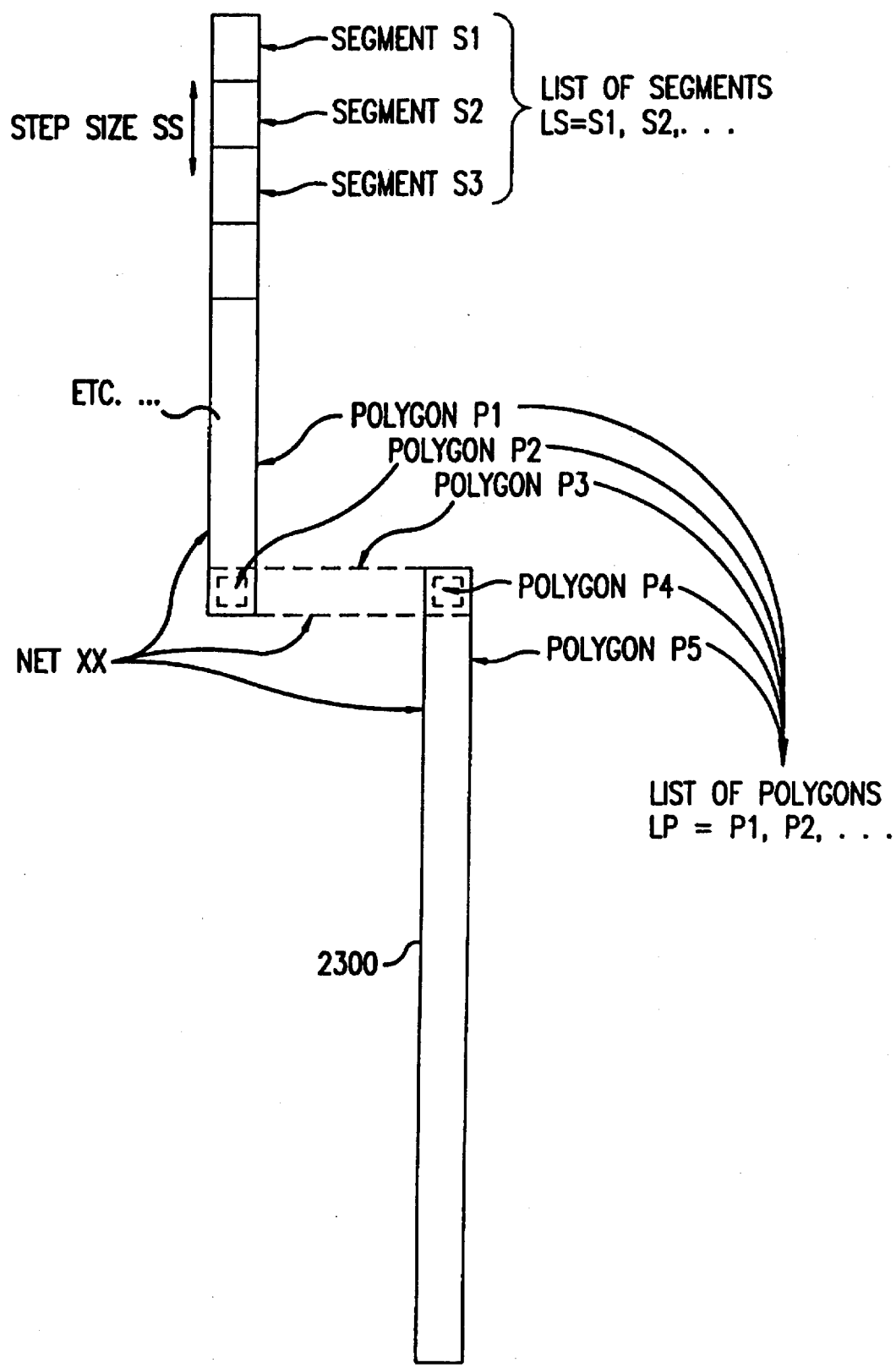
FIG. 24 shows how a list of polygons and a list of segments are prepared in accordance with the invention.

FIG. 24 schematically shows preparation of a list of polygons LP making up net XX (P1, P2, P3, P4, P5, etc.). A step size SS is predetermined, either by user selection or by default, to define the size of cinch segment to be evaluated. Each polygon is then broken into a segments of the step size, and a list of segments LS making up net XX is prepared. The list of segments includes segments S1, S2, S3, etc.

Figure 25:
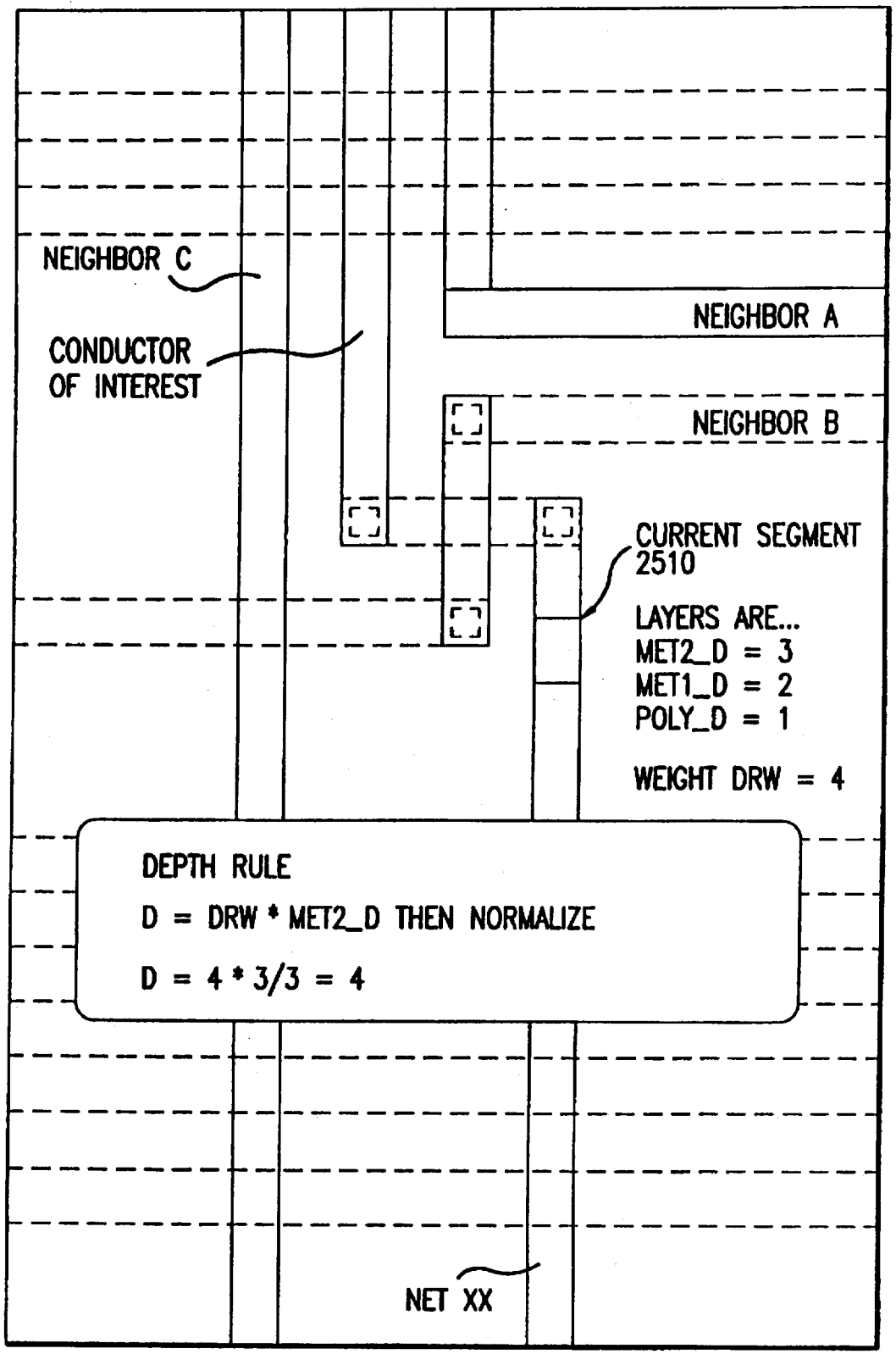
FIGS. 25–28 show application of the prober rules in accordance with the invention.

FIG. 25 shows application of the prober depth rule to a segment 2510 of net XX lying in the M2 layer. The layers are numbered from bottom to top, the polysilicon layer=1, M1=2, M2=3, etc. A weight DRW is assigned to the depth rule; in this case DRW=4. A depth rule value D for segment 2510 is computed by multiplying the depth rule weight by the layer number and dividing by the maximum layer number to normalize. In this example, $D=4*3/3=4$. The layer depth can be the layer number (counting from one for the deepest layer) as in this example, or the absolute depth of the layer from the surface (e.g., in microns).

Figure 26:
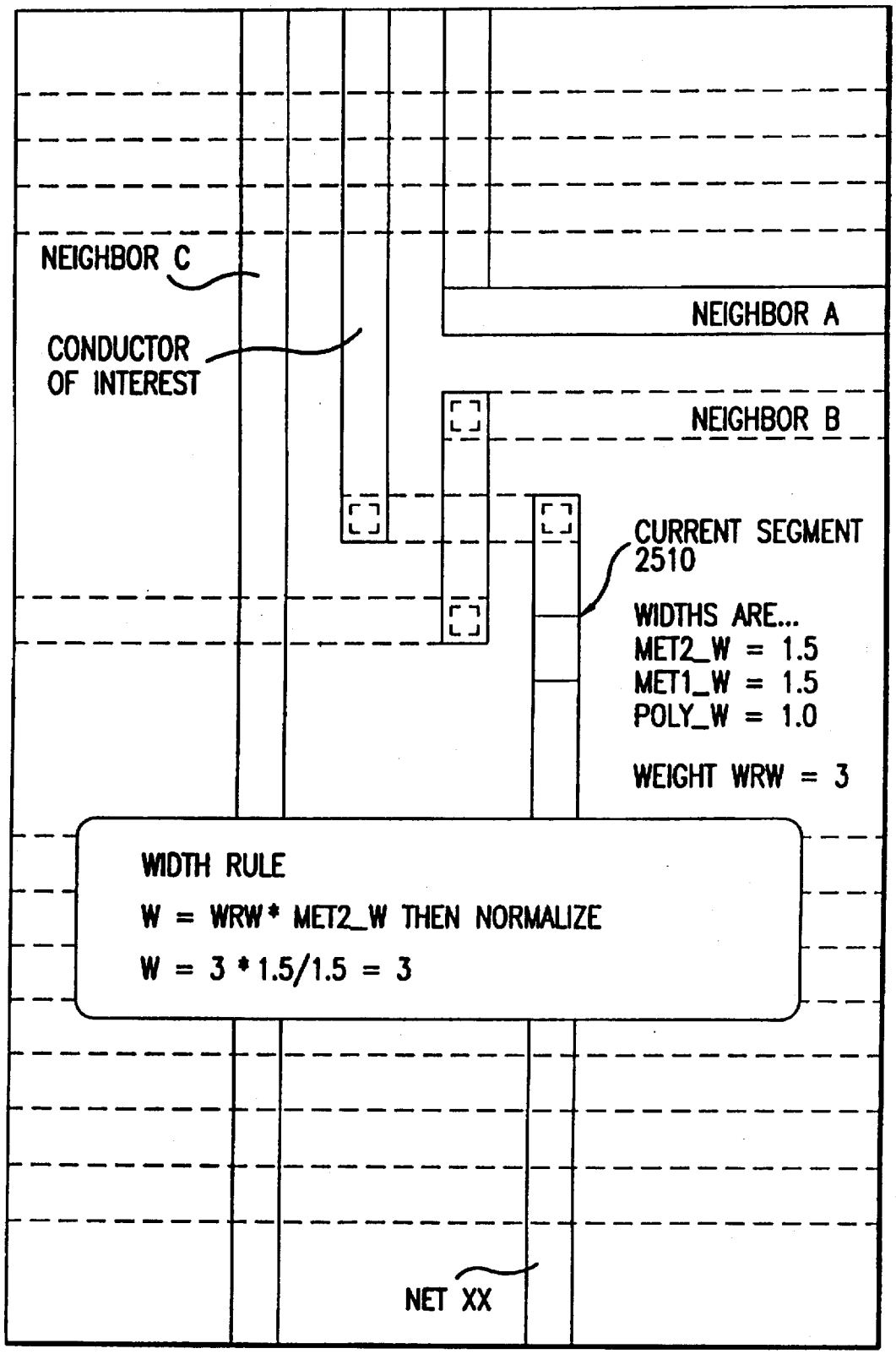

FIG. 26 shows application of the prober width rule to segment 2510 in layer M2 at which the conductor width is 1.5 µm. In this example, conductor widths in layer M2=1.5 µm, in layer M1=1.5 µm, and in polysilicon POLY=1.0 µm. A weight WRW is assigned to the width rule; in this case WRW=3. A width rule value W for segment 2510 is computed by multiplying the width rule weight by the segment's width and dividing by the maximum possible conductor width to normalize. In this example, W=3*1.5/1.5=3.

Figure 27:
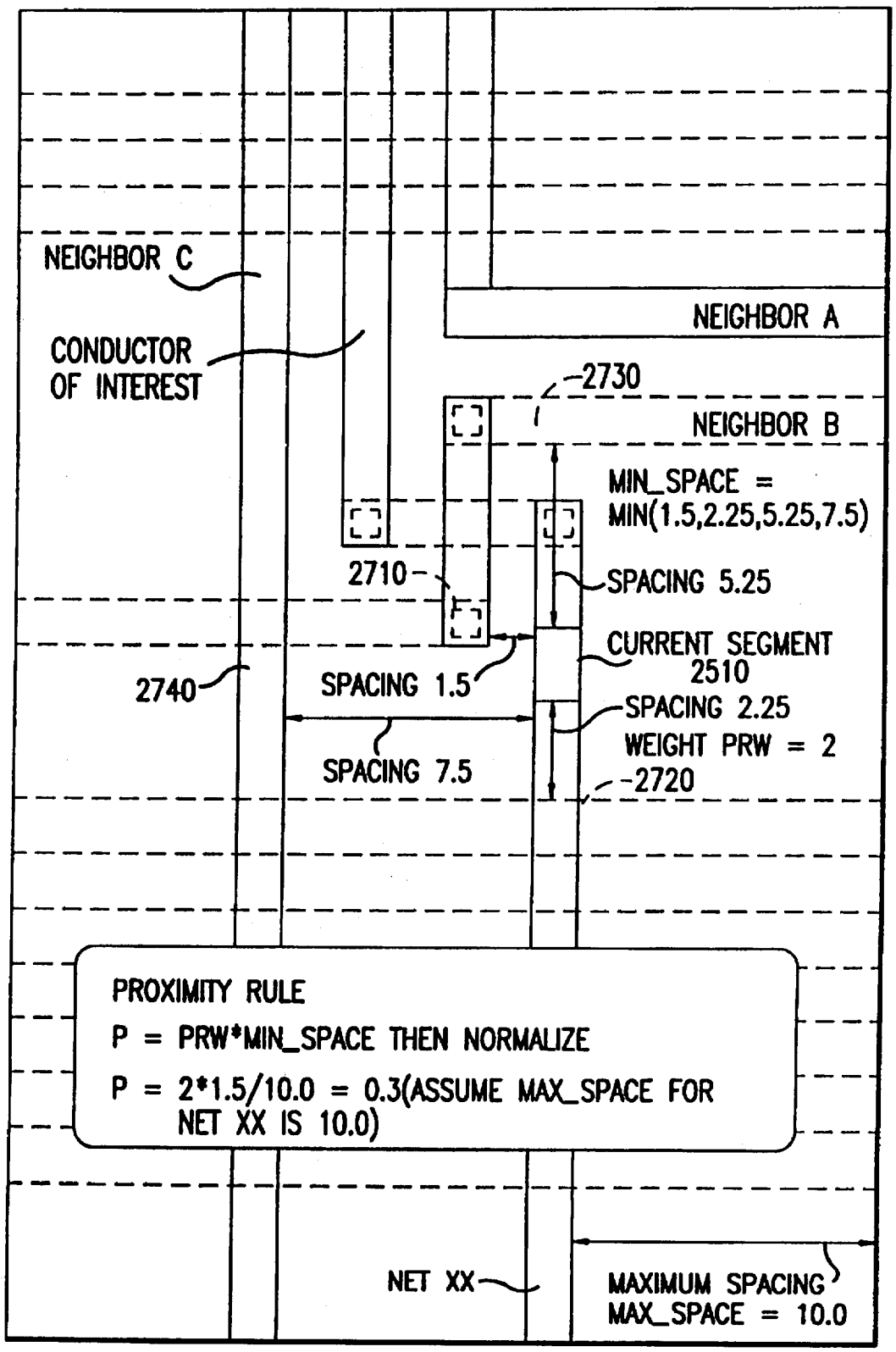

FIG. 27 shows application of the prober proximity rule to segment 2510. A value MinSpace is taken as the minimum distance from segment 2510 to any polygon of a neighboring conductor. In this example, the spacing of segment 2510 from polygon 2710 of neighbor C is 1.5 µm, from polygon 2720 is 2.25 µm, from polygon 2730 of neighbor B is 5.25 µm, and from polygon 2740 is 7.5 µm. The maximum spacing MaxSpace of net XX from an adjacent polygon is 10.0 µm in this example. Thus, MinSpace=1.5 µm. A weight PRW is assigned to the proximity rule; in this case PRW=2. A proximity rule value P for segment 2510 is computed by multiplying the proximity rule weight by the segment's MinSpace value (distance to the closest neighboring polygon that is not associated with the same signal and is not a power or ground line) and dividing by the MaxSpace value to normalize. In this example, P=2*1.5/10.0=0.3. Determining the distance from a segment to the closest neighboring polygon that is not part of the same signal requires a thorough search through polygon list LP.

Figure 28:
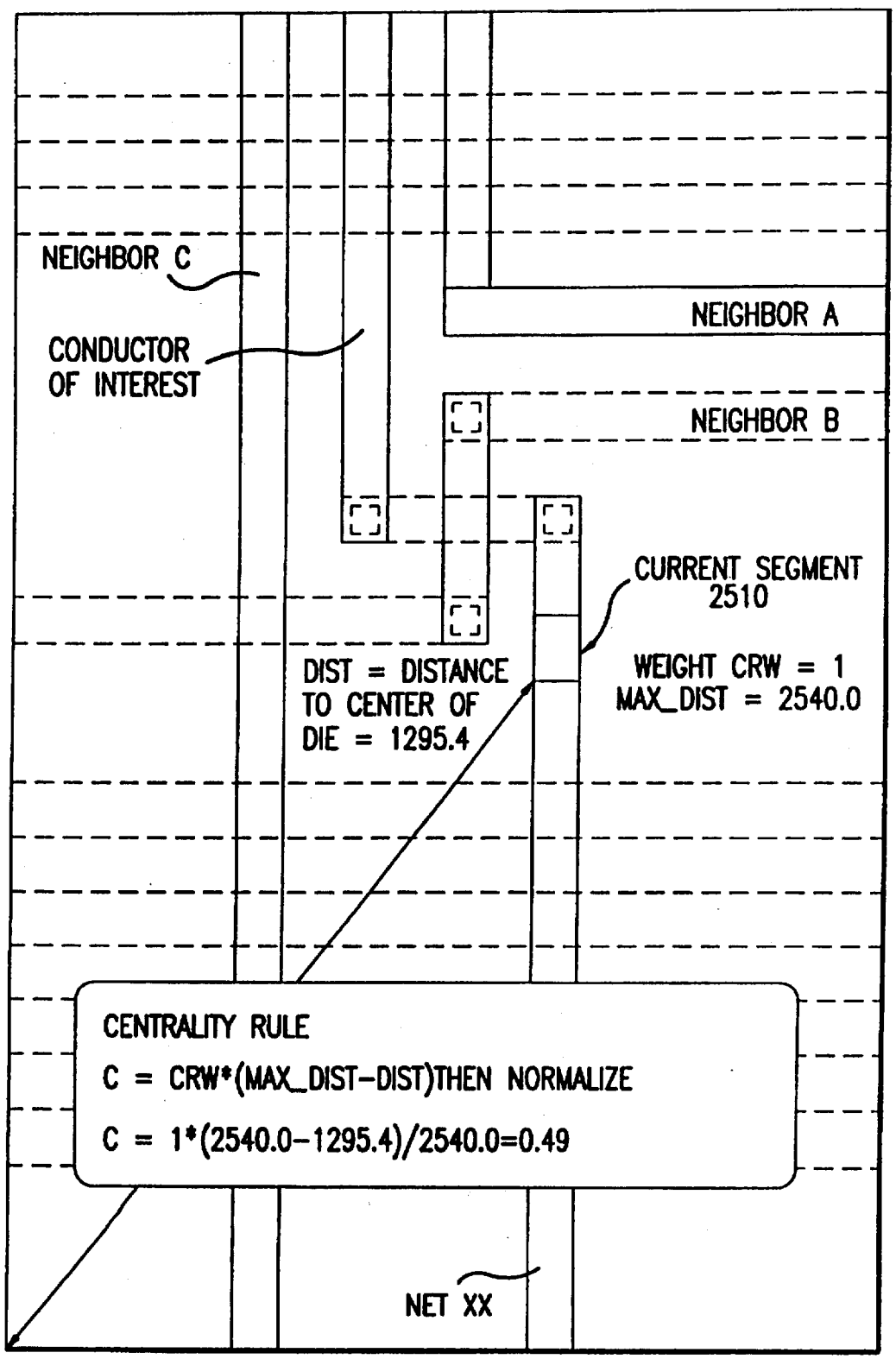

FIG. 28 shows application of the prober centrality rule to segment 2510. In this example, the distance of segment 2510 from the center of the die DIST=1295.4 µm, and the maximum possible distance of a segment from the center of the die MAX_DIST=2540.0 µm. A weight CRW is assigned to the centrality rule; in this case CRW=1. A centrality rule value C for segment 2510 is computed by multiplying the centrality rule weight by the difference MAX_DIST−DIST (the inverse of the segment's distance to the center of the die) and dividing by MAX_DIST to normalize. In this example, C=1*(2540.0−1295.4)/2540.0=0.49.

The weighted values produced by the prober rules are combined to obtain the prober score. In the example of FIGS. 25–28, the computed values of D, W, P and C are combined to obtain a prober score S1. A preferred way is to set S1=0 if D=0 or W=0 or P=0 or C=0, and otherwise to set S1=D+W+P+C. (Another way is to set S1=D*W*P*C, for example.)

In most contemporary devices, a net will have some part of its extent unobscured by overlying conductors. A probe point can thus be obtained using the probe rules and computing prober score S1, without the need for creating a probe-point hole. If a part of the net is unobscured, Prober score S1 for that part will be non-zero and the location for which the highest Prober score S1 is obtained indicates the best available probe point.

If desired, one can set a minimum threshold value for Prober score S1 below which even the best available probe point is deemed unacceptable for probing as is. This can happen if the best available probe point yields a noisy signal, such as when it causes an EBP to probe the signal on a buried conductor (hence, high noise and low signal) between two intermediate-level conductors (hence, high cross-talk). In such a case, it is preferable to cut a probe-point hole to provide a direct path for the EBP beam to land on the exposed conductor of interest to yield a cleaner measured signal.

It also increasingly happens that a net is entirely obscured under other conductors, especially large/wide power and ground plane conductors. This occurs, for example, with nets which are short, intra-logic-cell connections in custom and gate-array ICs. The Proximity rule will in such a case generate a subscore P of zero, causing Prober score S1 to be zero. This indicates that no accessible probe points were found along the extent of the net of interest.

If the "best" prober score indicates no optimal segment exists for probing, a set of probe-point cutter rules is then applied to compute a cutter score for each segment. The cutter score indicates suitability of the segment for placing a probe point. Application of the cutter rules indicates the least undesirable point to cut a probe opening. A segment having the "best" cutter score is considered optimal for placing a probe point. For each segment, a weighted value is computed for each of the rules. The weighted values produced by the probe-point cutter rules are combined to obtain the cutter score.

Figure 35:
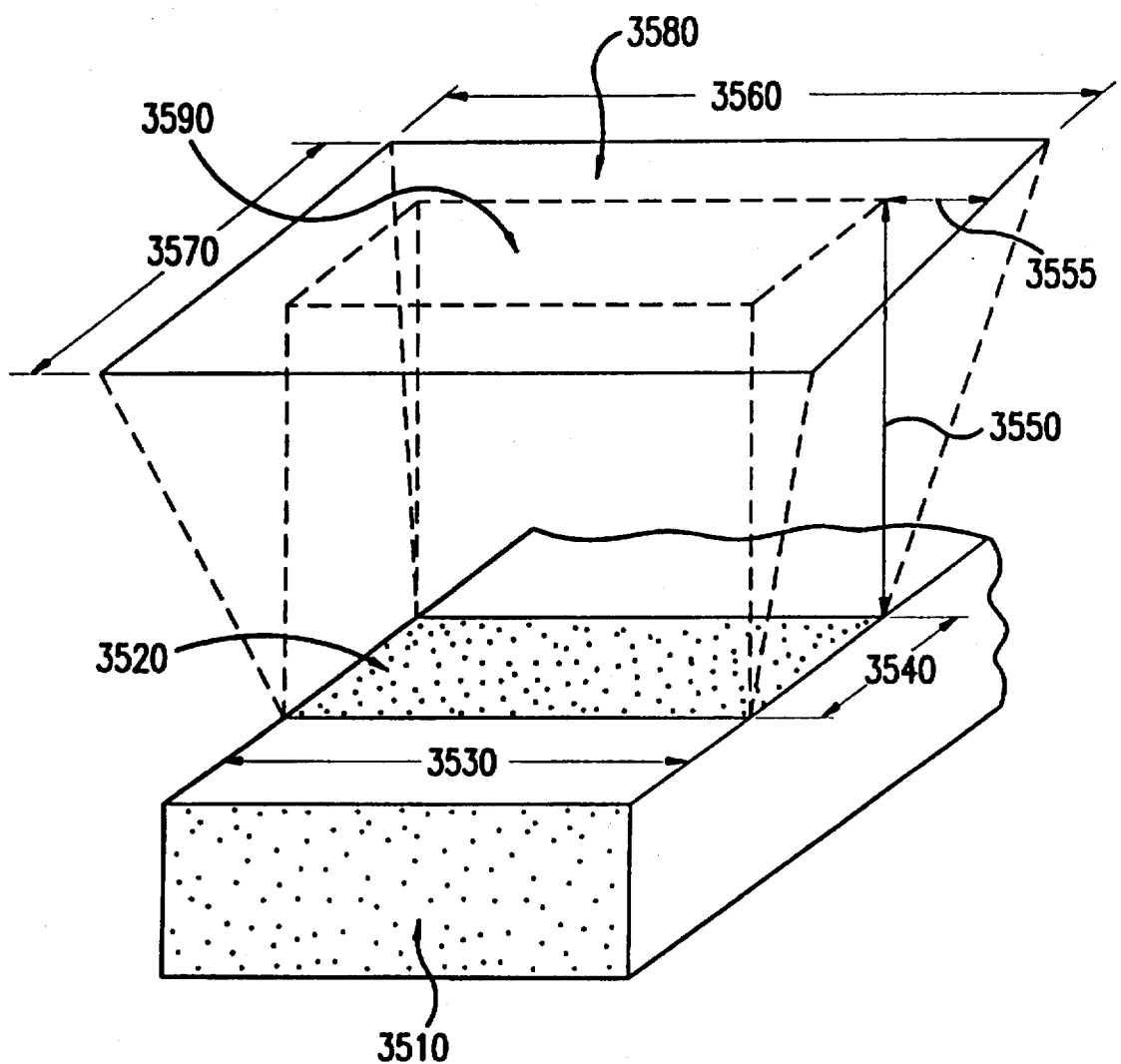
FIG. 35 shows how dimensions of a probe-point opening are scaled with depth and aspect ratio in accordance with the invention.

It is preferable for each layer to start with the intended dimensions of the bottom of the probe-point access hole, scale up to the surface based on the layer's depth and the hole's vertical aspect ratio, and store these in an array H indexed by layer number L, then use these hole dimensions H[L] in the steps below when considering a segment, instead of the segment's original dimensions. Referring to FIG. 35, a conductor 3510 is to be accessed by cutting a probe-point hole having a bottom surface 3520 of dimension 3530 by 3540. The hole is to be cut through a layer or layers having a thickness 3550 using a FIB milling process which produces a hole having a known aspect ratio. Using the aspect ratio and the dimensions 3530 and 3540, the corresponding dimensions 3560 by 3570 of an opening 3580 at the top 3590 of the probe hole are calculated. The aspect ratio is typically expressed as a ratio of thickness 3550 to dimension 3555.

Figure 29:
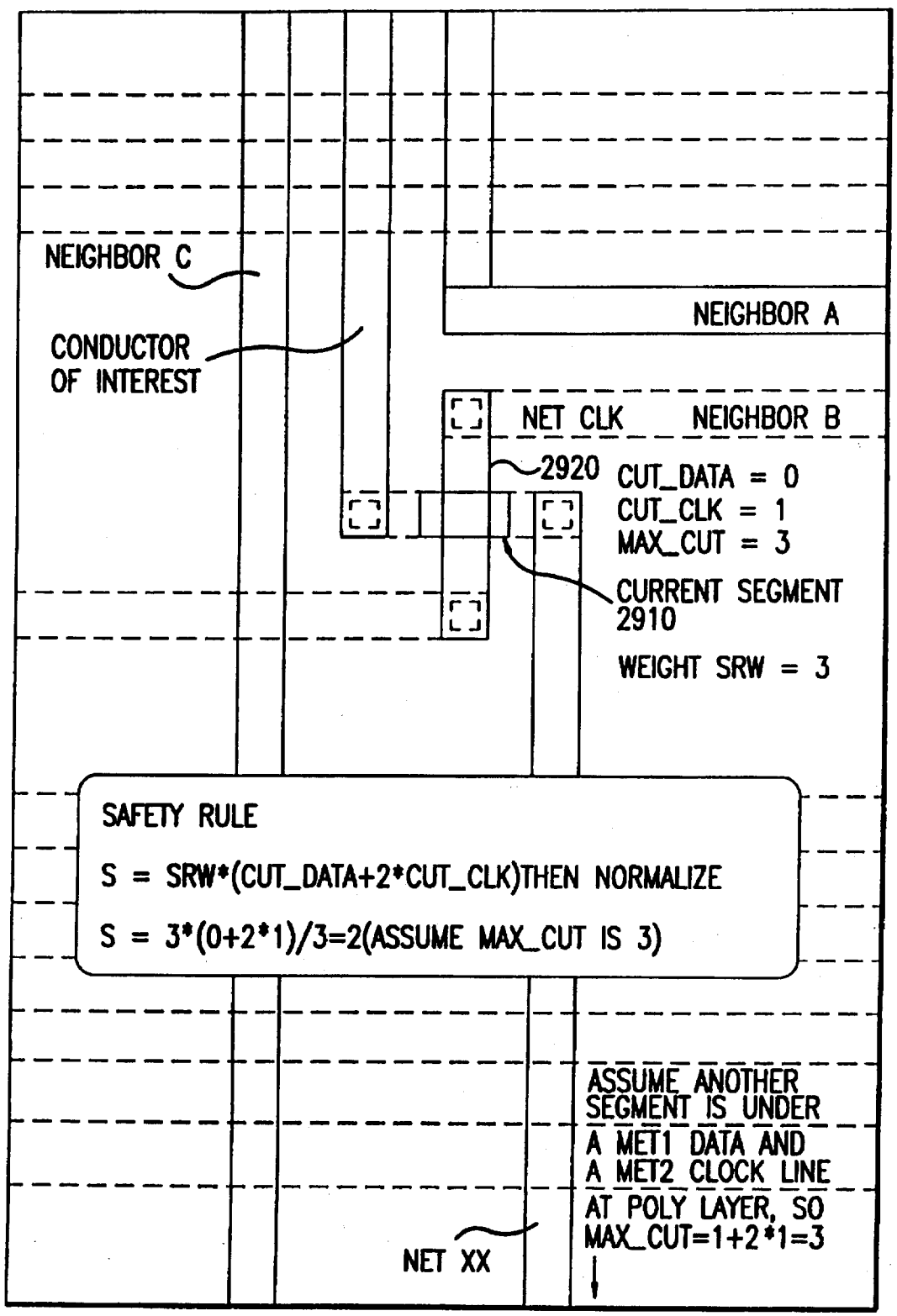
FIGS. 29–31 show application of the cutter rules in accordance with the invention.
Figure 30:
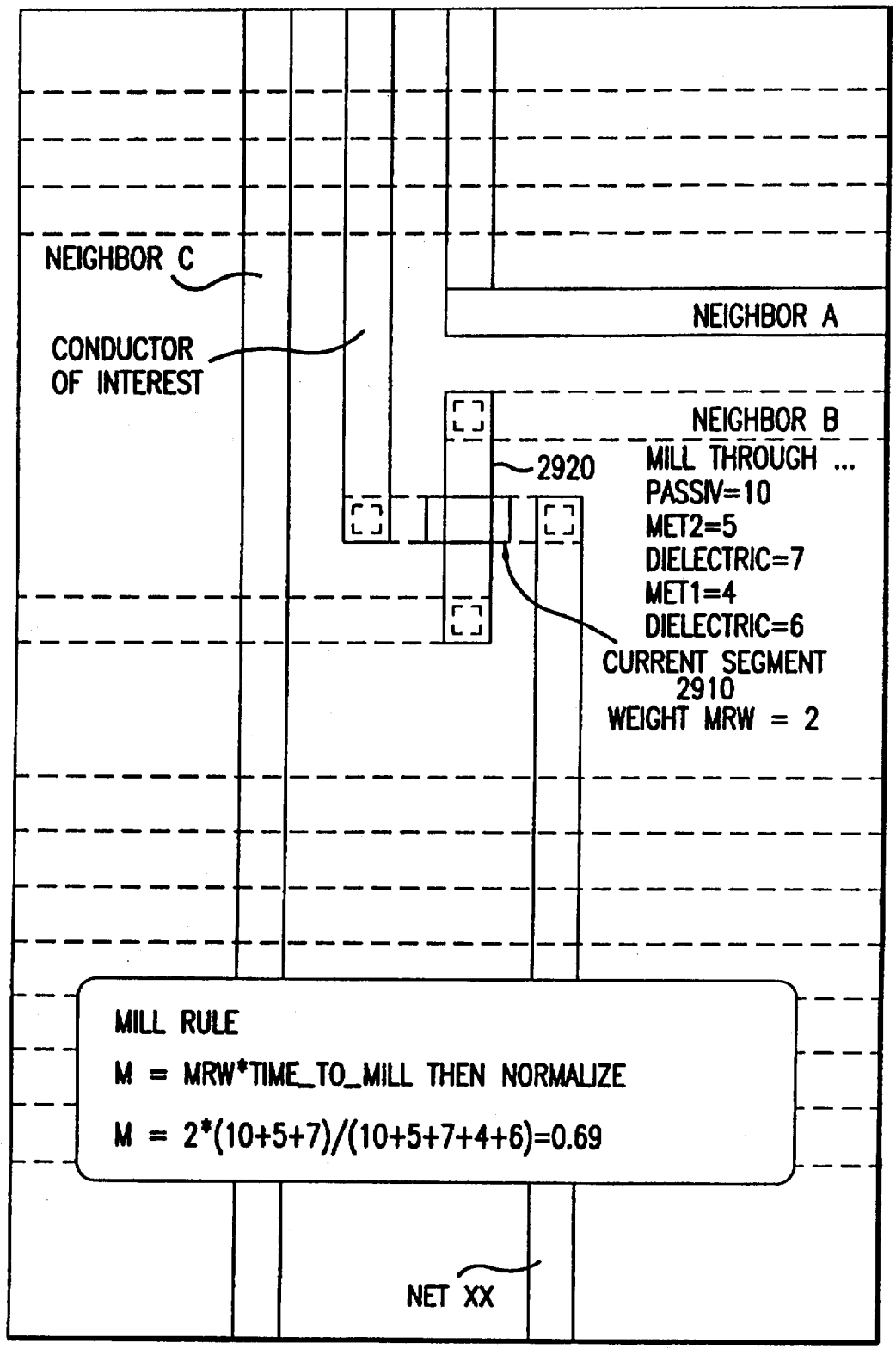

FIG. 29 shows application of the probe-point cutter safety rule to a segment 2910 lying in layer M1 of net XX. Polygon 2920 lying in layer M2 passes over segment 2910 and forms a part of net CLK carrying a clock signal. Cutting a data line is assigned a value equal to the number of times this segment overlaps partially or wholly with polygons of data lines; in this case, CUT_DATA=0. Cutting a clock line is assigned a value equal to the number of times this segment overlaps partially or wholly with polygons of clock or control lines; in this case, CUT_CLK=1. Weights are preferably assigned depending on the relative significance of cutting a line. These weights can be pre-set or user-defined. Clock lines and control lines are typically more important because they can affect operation of the entire IC, while a data line typically affects operation of only one cell. In the example of FIG. 29, a maximum cut value is determined by taking the sum of the CUT_DATA value and twice the CUT_CLK value. The maximum cut value for net XX in this example is determined by noting that another segment of the net lies below an M1 data line and an M2 clock line at the polysilicon layer, so that MAX_CUT=1*CUT_DATA+ 2*CUT_CLK=1*1+2*1=3. A weight SRW is assigned to the safety rule; in this case SRW=3. A safety rule value is computed by multiplying the safety rule weight SRW by the sum of the CUT_DATA value and twice the CUT_CLK value, then dividing by the MAX_CUT value to normalize. In this case, S=SRW*(CUT_DATA+CUT_CLK)/MAX_ CUT=3*(0+2*1)/3=2. Clock and control lines can be similarly distinguished to further discriminate between multiple undesirable probe-point hole cut locations FIG. 30 shows application of the probe-point cutter mill rule to segment 2910. Polygon 2920 lying in layer M2 passes over segment 2910. Milling through passivation is assigned a TIME_TO_MILL value of 10, through M2 a value of 5, through the dielectric below M2 a value of 7, through M1 a value of 4 and through the dielectric below M1 a value of 6. A weight MRW is assigned to the mill rule; in this case MRW=2. A mill rule value is computed by multiplying the mill rule weight MRW by the sum of the TIME_TO_MILL values of the layers to be milled for that segment, then dividing by the sum of the TIME_TO_MILL values of all layers to normalize. The TIME_TO_MILL values are estimates of the time to mill through each type of material, preferably user-specified. In this example where passivation, M2 and dielectric below M2 must be milled to expose net XX at the M1 level, $$M=MRW*(10+5+7)/(10+5+7+4+6)=0.69.$$

Figure 31:
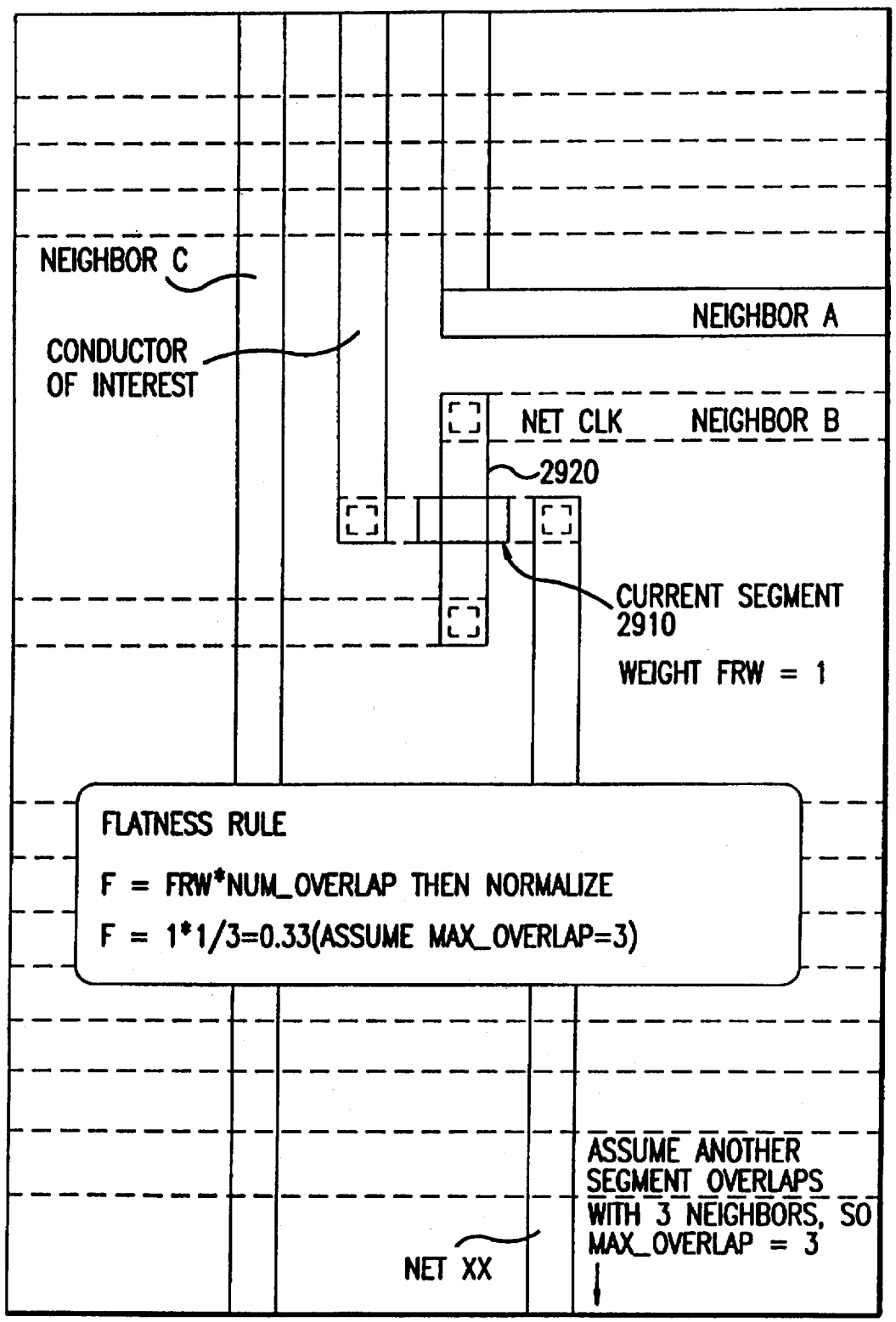

FIG. 31 shows application of the probe-point cutter flatness rule to segment 2910. Segment 2910 overlaps with one neighboring net: polygon 2920 of neighbor B passes over segment 2910. Thus, the number of overlaps NUM_OVERLAP=1. Some other segment of net XX overlaps with three neighboring nets, so the maximum number of overlaps MAX_OVERLAP=3. A weight FRW is assigned to the flatness rule; in this case FRW=2. A flatness rule value is computed by multiplying the flatness rule weight FRW by the number of overlaps NUM_OVERLAP, then dividing by the maximum number of overlaps MAX_OVERLAP to normalize. In this example, $$F=FRW*NUM\_OVERLAP/MAX\_OVERLAP=1*1/3=0.33.$$

Figure 32:
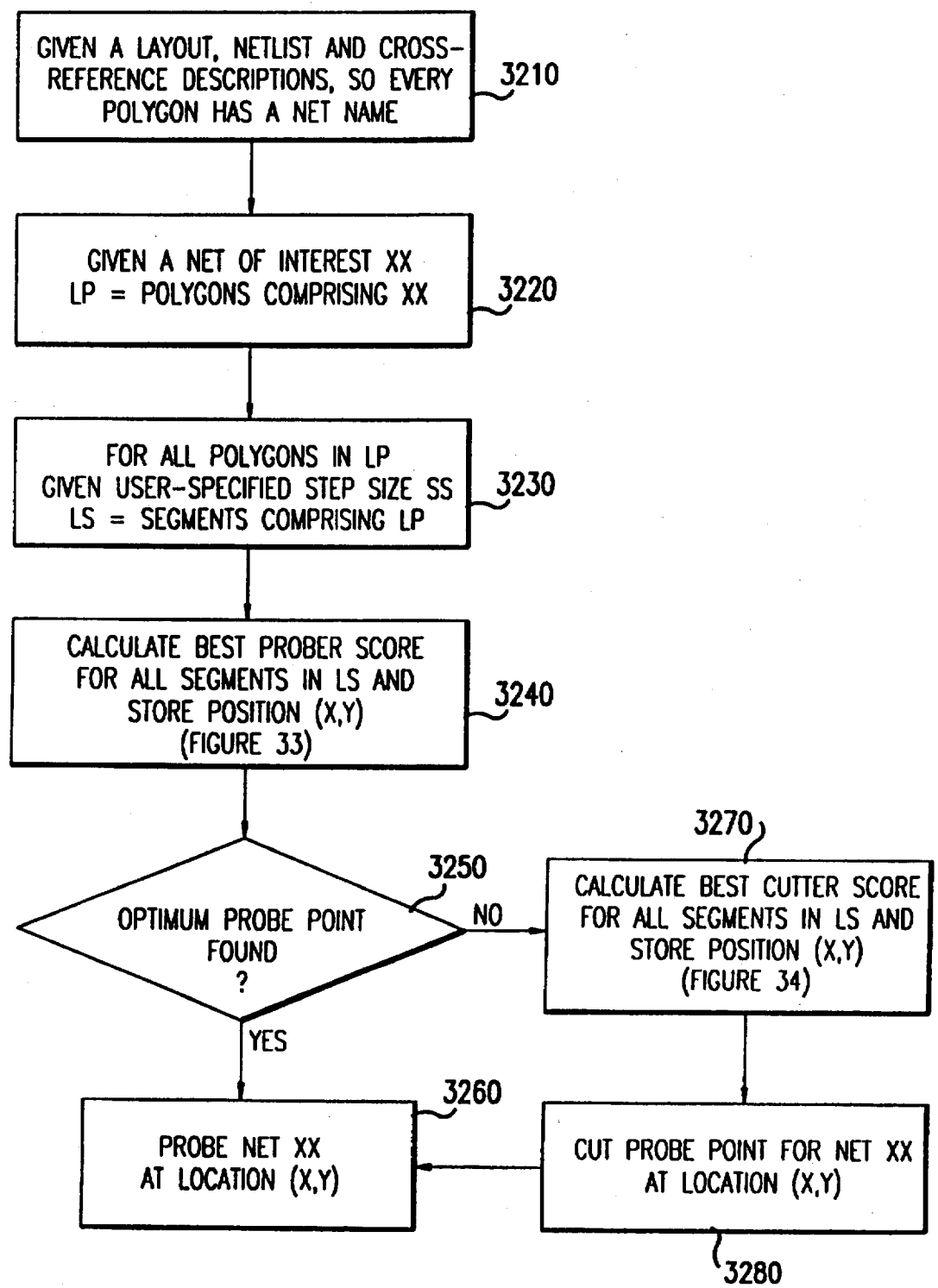
FIGS. 32–34 are flow charts showing prober and cutter methodology in accordance with the invention.
Figure 33:
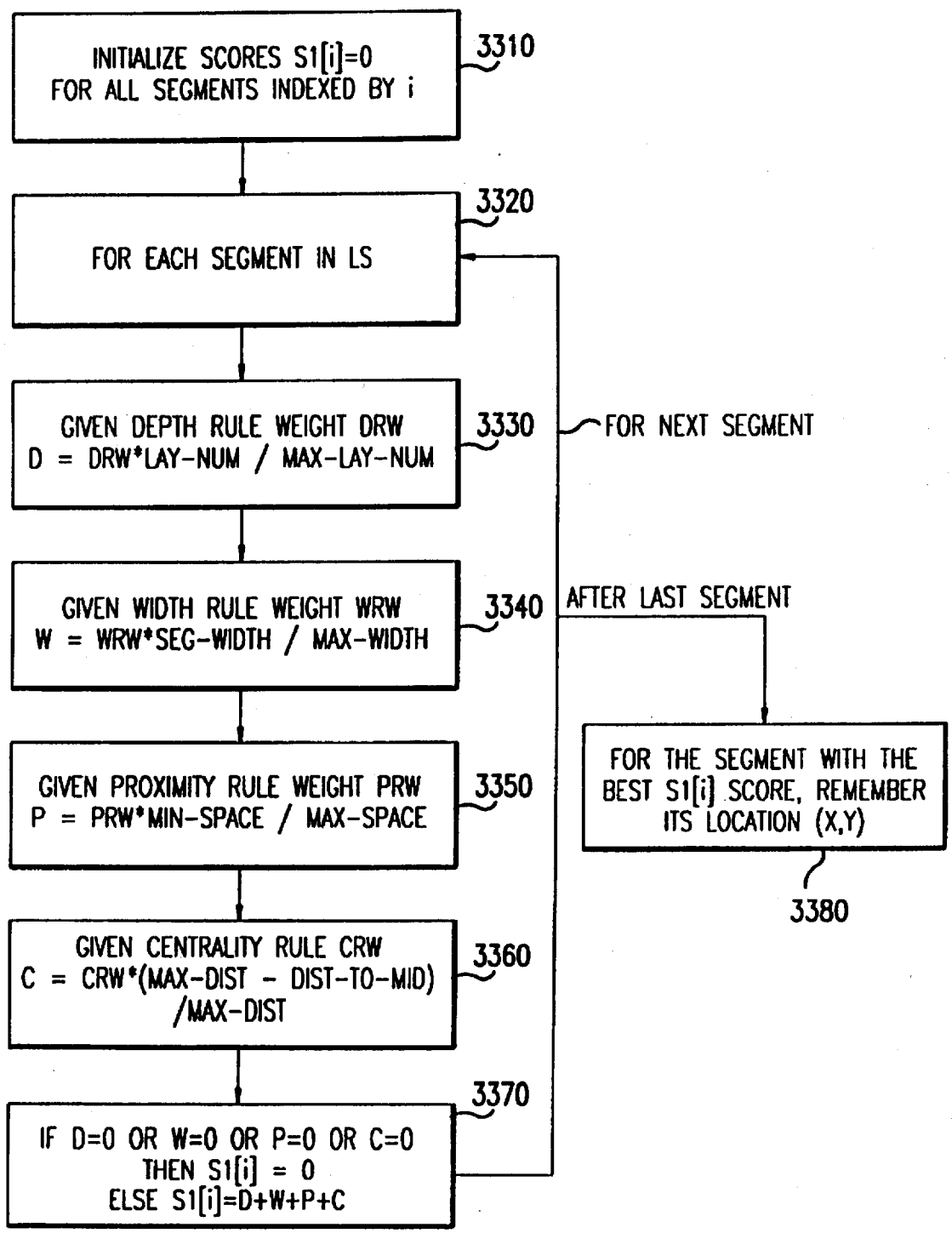
Figure 34:
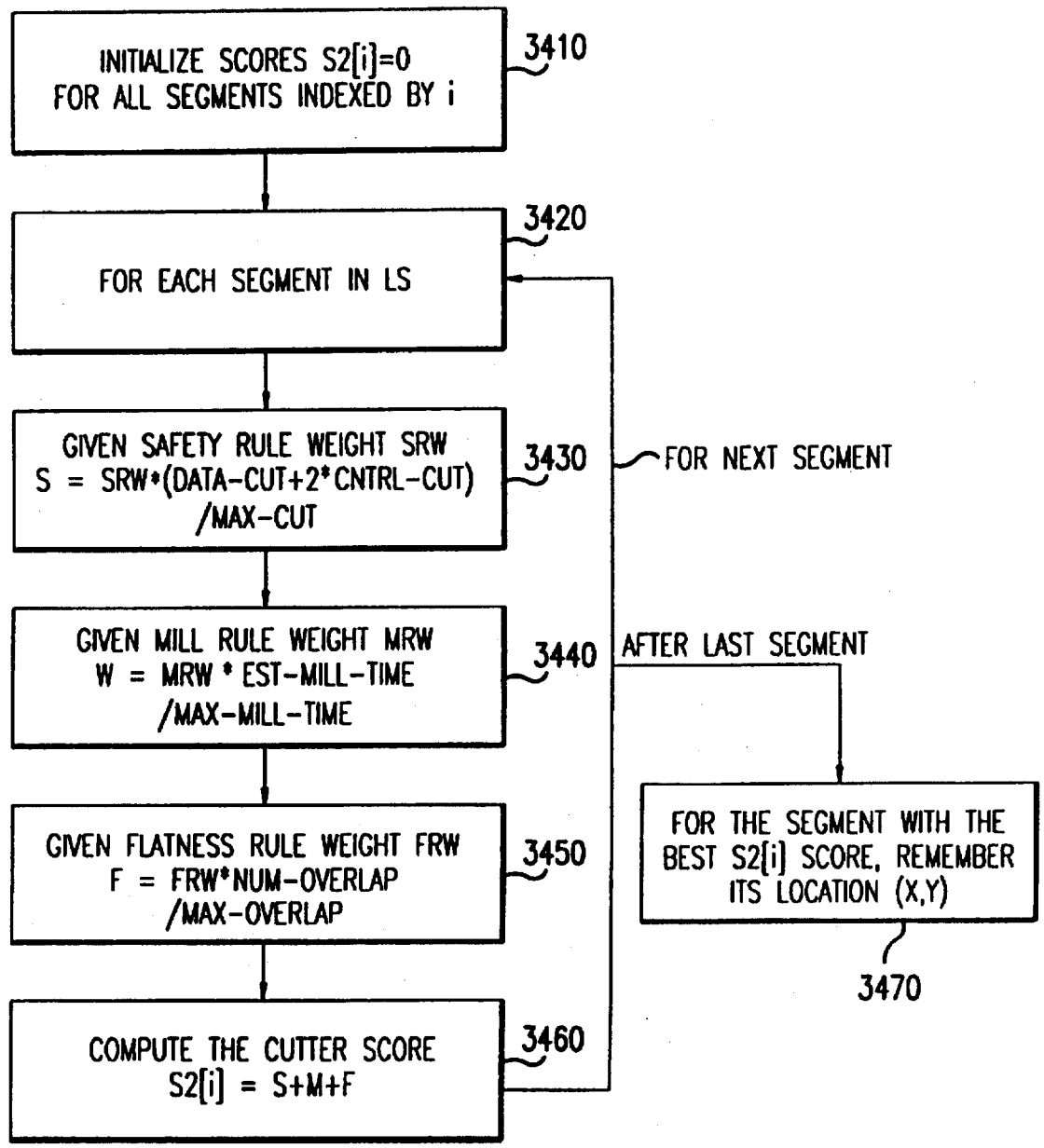

FIGS. 32-34 summarize a preferred methodology in accordance with the invention. In step 3210, layout, netlist and cross-reference descriptions are retrieved so that every polygon is associated with a net name. In step 3220, a list of polygons LP is prepared which associates with each net name a list of polygons. In step 3230, polygons of a net of interest are broken into segments of a user-specified (or default-specified) step size SS, and a list of the segments LS is prepared. In step 3240, the prober rules are applied to determine a prober score for each segment, a "best" prober score is determined, and the x,y location of the segment achieving the best prober score is stored (see FIG. 33). In step 3250, the best prober score is tested to see if an optimum probe point has been identified. The test can be user-specified or default-specified, such as checking to see whether the best prober score is zero or is below some threshold.

If an optimum probe point is identified, then in step 3260 the net is probed at the optimum probe point. If an optimum probe point is not identified, then in step 3270 the probe-point cutter rules are applied to determine a cutter score for each segment, a "best" cutter score is determined, and the x,y location of the segment achieving the best cutter score is stored (see FIG. 34). In step 3280, a probe point is cut at the location of the "best" cutter score, to make net XX accessible for probing. When the probe point has been exposed, then the net is probed in step 3260 at the exposed probe point.

The flow chart of FIG. 33 shows application of the prober rules to determine a prober score for each segment of a net. In step 3310, the prober score for each segment i is initialized at S1[i]=0. In step 3320, a first segment is selected from segment list LS. In steps 3330-3360, weighted values for the segment are computed for each of the depth rule, width rule, proximity rule and centrality rule. In step 3370, a prober score S1[i] is determined from the weighted values of steps 3330-3360. Steps 3320-3370 are repeated for each segment of segment list LS. After determining a prober score for the last segment, the segment with the highest prober score S1[i] is determined in step 3380, and the corresponding probe location is stored.

The flow chart of FIG. 34 shows application of the probe-point cutter rules to determine a cutter score for each segment of the net. In step 3410, the cutter score for each segment i is initialized at S2[i]=0. In step 3420, a first segment is selected from segment list LS. In steps 3430-3460, weighted values for the segment are computed for each of the depth rule, width rule, proximity rule and centrality rule. In step 3460, a cutter score is determined from the weighted values of steps 3430-3450. Steps 3420-3460 are repeated for each segment of segment list LS. After determining a cutter score for the last segment, the segment with the highest cutter score S2[i] is determined in step 3470, and the corresponding probe-point location is stored.

Methods of the present invention can work strictly from the available layout data, apply the prober and probe-point cutter rules in an interactive fashion, display the optimal probe-point location on the display of an EBP, MP or FIB system, and drive the system to center on that location of the device. Schlumberger's IDS-class systems have the Layout Tool tied to the system's stage so that highlighting the polygon segment of the optimal probe-point location has the effect of actuating stage motors and moving the operator to that location on the device in preparation for EBP or MP probing or for FIB probe-point cutting.

Providing user-specifiable weights allows flexibility in prioritizing the rules to match a given manufacturing process and operator's preferences. These weights can, if desired, be made user-controllable via a pop-up control panel display and can be readily changed to affect each computation of the optimal location. Providing a user-specifiable step size allows computations for the entire conductor to be completed more quickly by taking larger steps. There is a trade-off of computation speed versus optimality since a larger step size can cause the software to step past the true optimal probe point.

Figure 36:
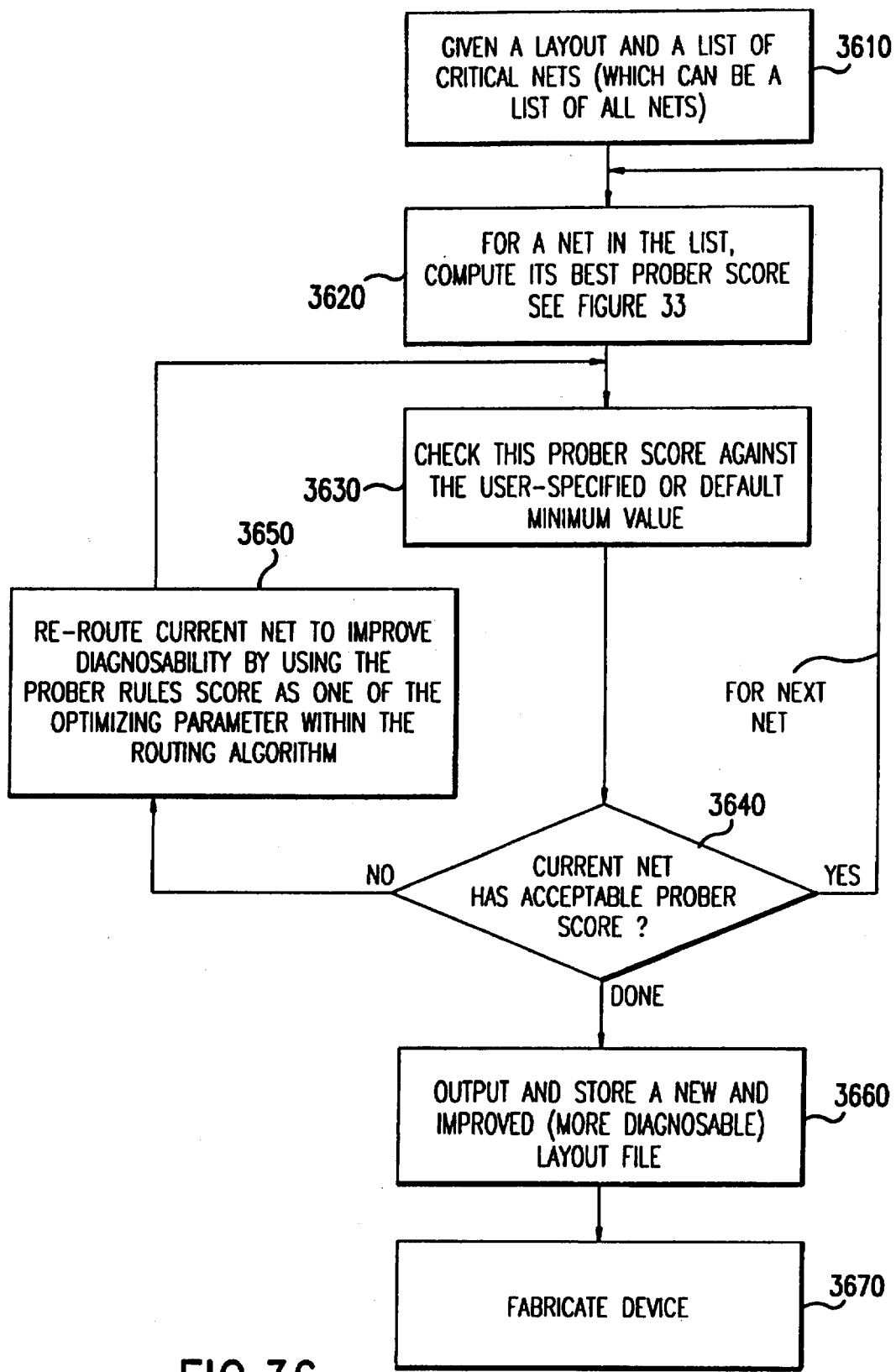
FIG. 36 is a flow chart of a method in accordance with the invention for modifying layout of an IC to improve accessibility of selected nets to probing.

The methods of the invention can also be used in an IC design process. After preparing routing and layout of an IC using conventional CAD tools, the rules are applied to the polygons associated with each signal path of interest to obtain a score indicating how easy the corresponding nets of the IC will be to probe for diagnosis. If key signal paths will be difficult to probe, the routing and layout can be performed again to make selected signal paths more accessible. FIG. 36 is a flow chart of a preferred method. In step 3610, layout, netlist and cross-reference descriptions are retrieved so that every polygon is associated with a net name. Each net name is associated with a list of polygons, and the polygons of each net of interest are broken into segments of a specified step size. In step 3620, a best prober score S1 is determined for a net of interest, e.g., as in the method of FIG. 33. In step 3630, the best prober score S1 is compared with a user-specified or default-specified value. In step 3640, if the net has an acceptable prober score (indicating there is a net segment which meets minumum standards for probing), steps 3620-3640 are repeated for the next selected net of the list. If the net does not have an acceptable prober score, the net is re-routed in step 3650 to make the net more accessible for probing. The prober rules score is preferably used as an optimizing parameter in the routing algorithm. Steps 3630-3640 are repeated to confirm that the re-routed net has an acceptable prober score and, if not, step 3650 is repeated to again re-route the net. When all nets of interest have been routed for acceptable probing accessibility, an improved layout file is output to storage in step 3660. In step 3670, the improved layout file is used to prepare masks and fabricate an IC in which the nets of interest are accessible for probing.

The foregoing description of preferred embodiments of the invention is intended as illustrative only, and not as a limitation of the invention as defined by the claims which follow. Those of skill in the art will recognize many modifications which may be made in the preferred embodiments within the spirit and scope of the claimed invention.

For example, other FIB rules can be applied which take into account such things as:

- susceptibility of a device structure (e.g., a memory cell) to FIB-induced particle or electrical damage, thereby keeping prospective probe points away from sensitive structures such as memory cells,
- physical constraints on the aspect ratio of a hole which can affect the ability of secondary electrons to escape from the bottom of the hole, thereby preferring holes that have a smaller depth-to-width aspect ratio,
- the availability of insulator- or conductor-preferential milling dependent on what gas is used to assist the etching process, thereby changing the selection of probe points based on relative insulator/conductor thicknesses and milling rates,
- the use and impact of insulator deposition which can allow for high-aspect-ratio probe holes to be cut and then filled by conductive material deposited in a safety "moat" of deposited insulator to bring a signal of interest up to the surface of the IC, thereby allowing the use of probe locations where only high-aspect-ratio holes can be cut,
- the ability to perform good end-point detection to know when the target conductor is reached, this end-point detection being dependent on the secondary-electron yield properties of the conducting material and its covering insulating material, thereby changing the selection of probe points based on different material combinations, and
- the amount of leakage to be expected from uncontrolled redeposition of etched material which provides an unwanted conduction path (leak) affecting signal quality, thereby changing probe-point selection based on such parameters as etch time, beam size and current, and etched material.

These and other rules can be incorporated into the methodology of the invention by adding further weighted computations in a manner similar to those described above. The described probe-point cutter rules can also be used independently of the prober rules.

Methods of the present invention are applicable not only to EBP, MP and FIB operation, but also to operation of laser beam systems, e.g., for cutting probe points and depositing conductive and insulative material.

The methods and apparatus of the present invention can also be used to advantage in modifying an IC. For example, an optimal location can be determined for severing (rather than merely exposing) a conductor to break an electrical connection, much like milling a probe-point hole. Also, optimal locations can be determined for exposing a pair of nets so that conductive material can be deposited to establish electrical connection between these nets. Insulative material can be deposited as needed to prevent the deposited conductive material from contacting other nets. Techniques for deposition of conducting and insulating materials using FIB, laser, and electron-beam systems are known in the art.

The method of FIG. 36 is intended to re-route nets without changing logical functionality of the IC. The method can be modified to insert circuit elements which help diagnosability with or without affecting the intended logical functionality. For example, a net of interest may still have a poor prober score even after re-routing. To make this net more accessible to probing, the IC design can be modified by inserting a bond pad or via at or near the surface of the IC, with a vertical connection down to the net. Other nets can then be rerouted as needed to accomodate this new construction. Another example is the addition to an IC design of a special transistor configuration which will switch to a desired state based on presence or absence of a current-injection electron beam. This transistor configuration can be used to drive certain nets to a desired state. The electron beam used for current injection can be the same one used for probing, but with different conditions of beam current, dwell time, etc. After adding such elements to the design, the prober rules can be applied to assure the elements are accessible to the electron beam.

Figure 1:
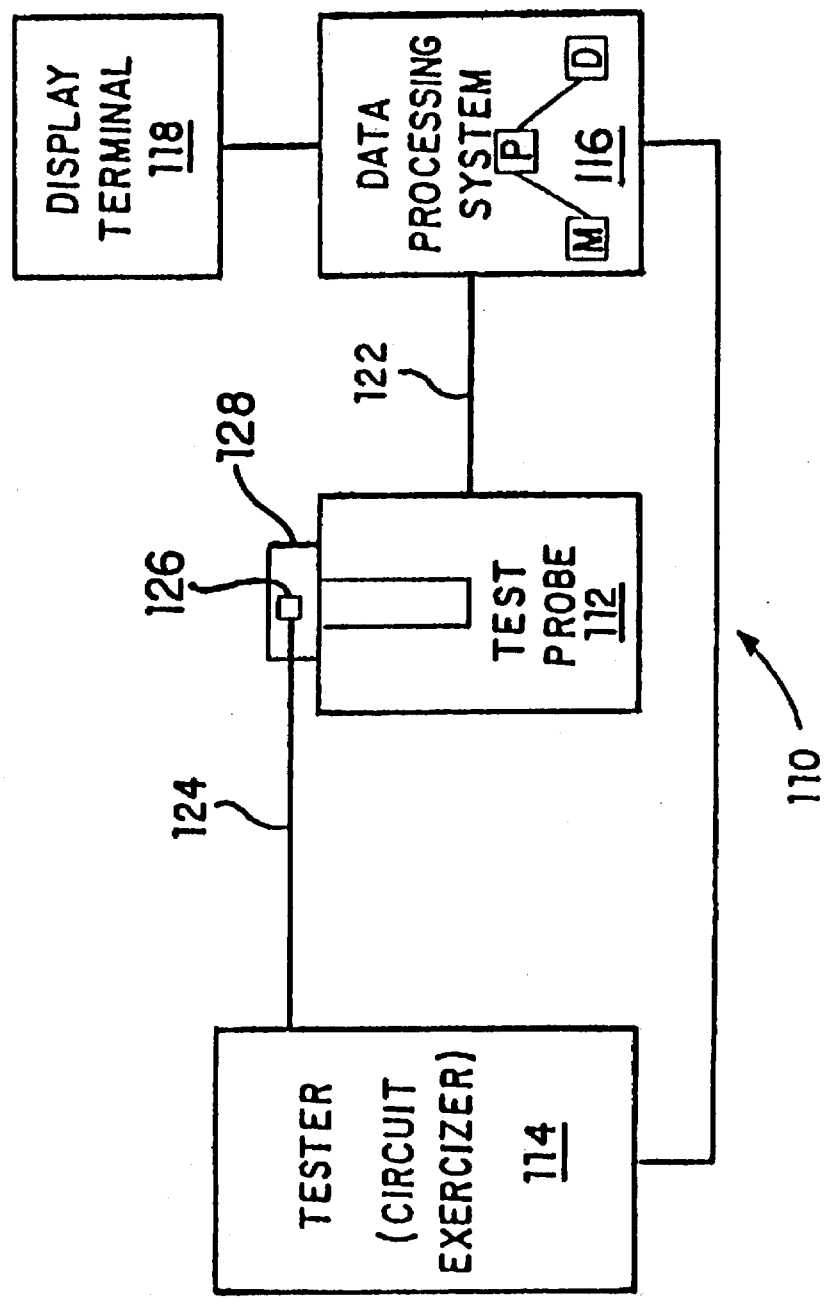
FIG. 1 is a block diagram of a prior-art charged-particle probe system.
Figure 2:
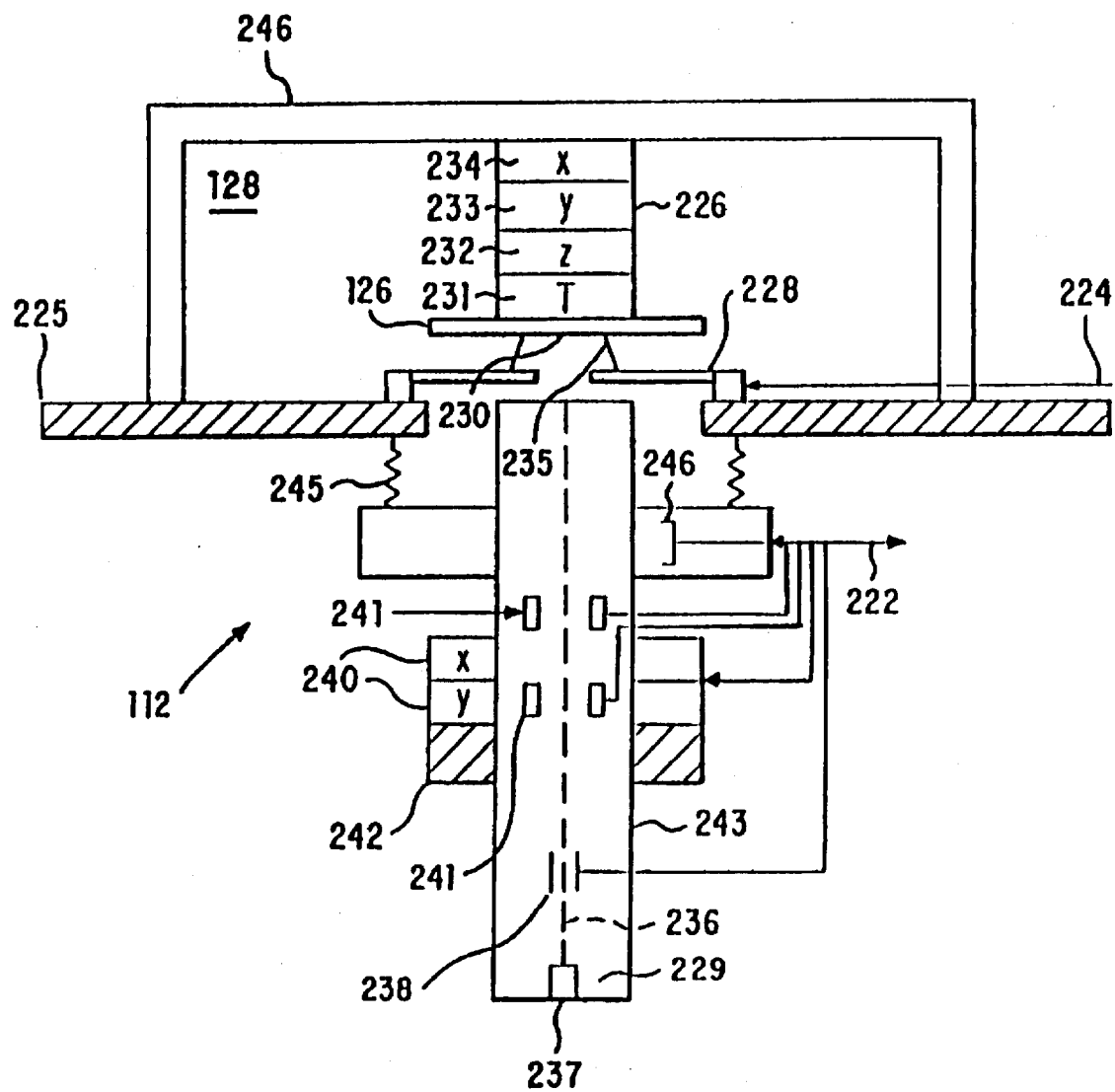
FIG. 2 shows a prior-art electron-beam test probe of a system as shown in FIG. 1.
Figure 3:
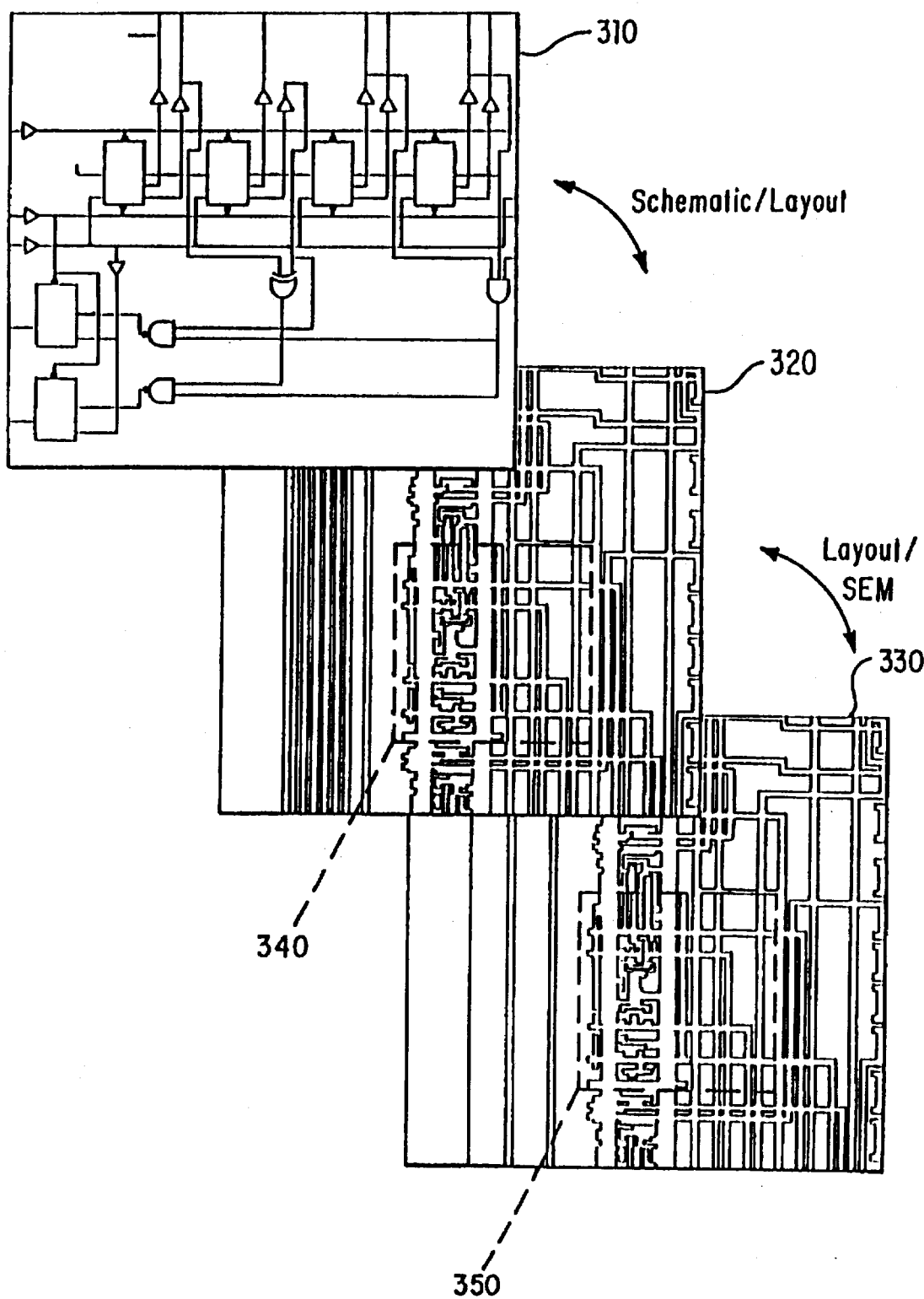
FIG. 3 shows an example of linked schematic, layout, and SEM images.
Figure 4:
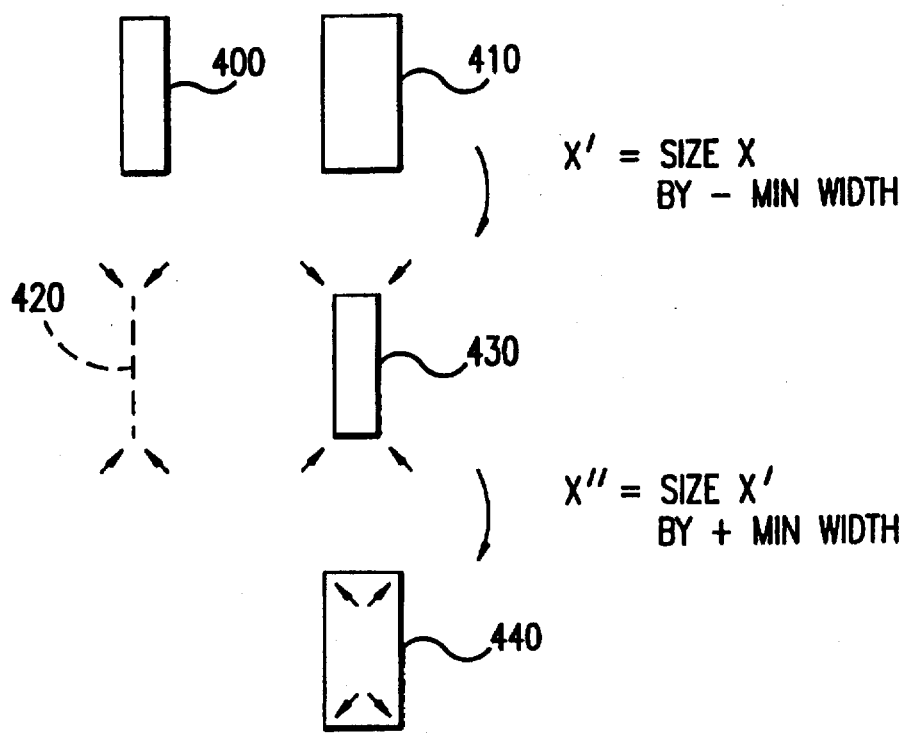
FIG. 4 shows application of a prior-art DRC "Width" rule.
Figure 5:
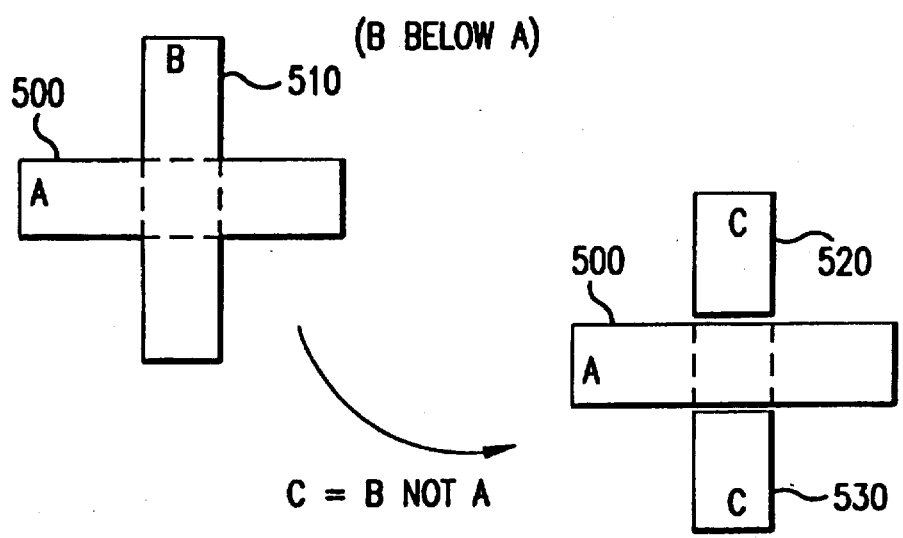
FIG. 5 shows application of a prior-art DRC "Depth" rule.
Figure 6:
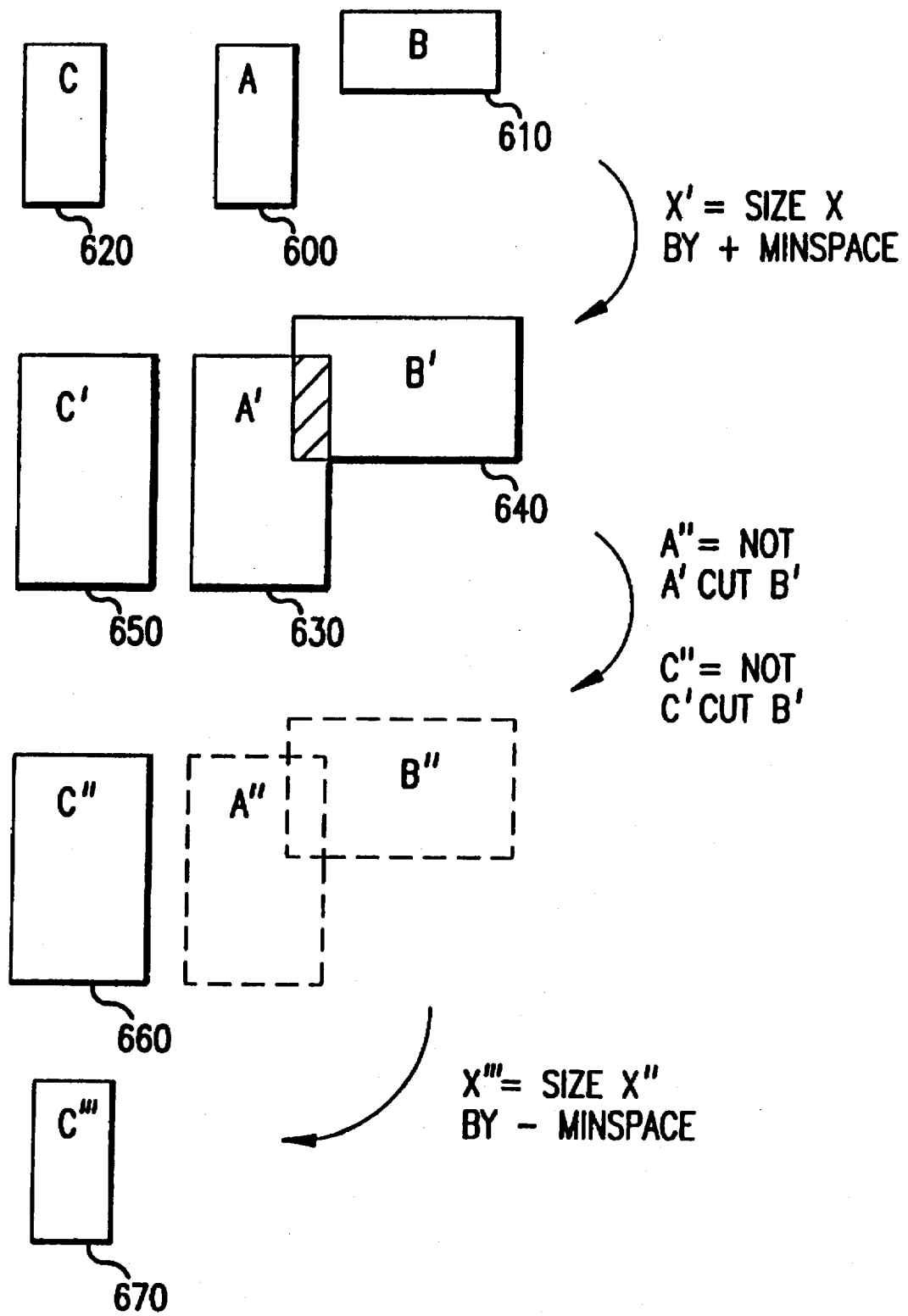
FIG. 6 shows application of a prior-art DRC "Proximity" rule.

The invention includes apparatus for carrying out the described methods and methodology. Such apparatus preferably comprises a suitably-programmed general-purpose computer system, such as that of data processing system 116 (FIG. 1) or a CAD workstation system used to perform routing and layout of an IC.

We claim:

1. A method of preparing an IC layout description having selected nets routed for accessibility to diagnostic probing, comprising the steps of:

a. retrieving from storage a description of the IC which defines a set of polygons separated into layers and which relates the polygons to nets of the IC;

b. for a selected net, breaking its polygons into segments of predetermined step size, each segment corresponding to a physical incremental net location of the IC, and computing for each segment a Prober score which is dependent upon suitability of the corresponding net location for probing;

c. testing the Prober score for each segment of the selected net against a predetermined acceptable value;

d. re-routing the selected net if the Prober score for all segments of the selected net fail to meet the predetermined acceptable value;

e. repeating steps c. and d. until a Prober score for at least one segment of the selected net meets the predetermined acceptable value; and f. preparing and storing a layout description of the IC in which the selected net is routed so as to have at least one segment with a Prober score meeting the predetermined acceptable value.

2. The method according to claim 1, further comprising the step of fabricating an IC from the layout description, wherein at least one segment of the selected net has a Prober score indicating the selected net is suitably routed for diagnostic probing.

3. The method according to claim 1, further comprising the step of repeating steps b.–e. for each of a plurality of selected nets.

4. The method according to claim 1, wherein computing a Prober score for a segment of the IC comprises computing a depth score indicating suitability of the segment for probing based on depth of the segment from a surface of the IC.

5. The method according to claim 1, wherein computing a Prober score for a segment of the IC comprises computing a width score indicating suitability of the segment for probing based on width of the segment.

6. The method according to claim 1, wherein computing a Prober score for a segment of the IC comprises computing a proximity score indicating suitability of the segment for probing based on proximity of the segment to other nets of the IC.

7. The method according to claim 1, wherein computing a Prober score for a segment of the IC comprises computing a centrality score indicating suitability of the segment for probing based on position of the segment relative to a central region of the IC.

8. The method according to claim 1, wherein computing a Prober score for a segment of the IC comprises:

i. computing, for each of a plurality of characteristics of the IC, a subscore indicating suitability of the segment for probing, ii. defining a respective weight for each of the subscores, and iii. combining the subscores in accordance with their respective weights to produce the Prober score.

9. The method according to claim 1, wherein computing a Prober score for a segment of the IC comprises:

i. computing a depth score indicating suitability of the segment for probing based on depth of the segment from a surface of the IC, ii. computing a width score indicating suitability of the segment for probing based on width of the segment, iii. computing a proximity score indicating suitability of the segment for probing based on proximity of the segment to other nets of the IC, iv. computing a centrality score indicating suitability of the segment for probing based on position of the segment relative to a central region of the IC, and v. combining the depth score, the width score, the proximity score and the centrality score to produce the Prober score.

10. A method of probing an IC having a plurality of nets, comprising the steps of:

a. retrieving from storage a layout description of the IC which defines a set of polygons separated into layers, a netlist description of the IC which defines relationships between nets and devices, and a cross-reference description of the IC which defines relationships between polygons in the layout and nets in the netlist;

b. creating data structures which associate with each net name a list of polygons;

c. for a selected net, breaking its polygons into segments of predetermined step size, each segment corresponding to a physical incremental net location of the IC, and computing for each segment a Cutter score which is dependent upon suitability of the corresponding net location for placing a probe point;

d. storing a representation of the net location corresponding to a segment for which the computed Cutter score indicates an optimal location for probe-point placement;

e. cutting a probe-point opening in the IC to make the selected net accessible at the optimal location indicated by the Cutter score; and f. probing the selected net at the optimal location indicated by the Cutter score.

11. Apparatus for probing at an optimal probe-point a net of an IC having a plurality of nets, comprising:

a. means for storing a layout description of the IC which defines a set of polygons separated into layers, a netlist description of the IC which defines relationships between nets and devices, a cross-reference description of the IC which defines relationships between polygons in the layout and nets in the netlist, and a data structure which associates with each net name a list of polygons;

b. means for breaking polygons of a selected net into segments of predetermined step size, each segment corresponding to a physical incremental net location of the IC;

c. means for computing for each segment a Prober score which is dependent upon suitability of the corresponding net location for probing;

d. means for evaluating whether the Prober score indicates an optimal segment exists for probing and for storing, if an optimal segment exists for probing, a representation of the net location corresponding to that segment;

e. means for computing for each segment a Cutter score which is dependent upon suitability of the corresponding net location for placing a probe point, if the Prober score indicates no optimal segment exists for probing;

f. means for storing a representation of the net location corresponding to a segment for which the computed Cutter score indicates an optimal location for probe-point placement;

g. means for cutting a probe-point opening in the IC to make the selected net accessible at the optimal probe location; and h. means for probing the selected net at an optimal probe-point location indicated by the Prober score or the Cutter score.

* * * * *